(12) United States Patent
Matsushima et al.

(10) Patent No.: US 10,854,744 B2
(45) Date of Patent: *Dec. 1, 2020

(54) SEMICONDUCTOR DEVICE

(71) Applicant: Panasonic Intellectual Property Management Co., Ltd., Osaka (JP)

(72) Inventors: Yoshihiro Matsushima, Shiga (JP); Shigetoshi Sota, Kyoto (JP); Eiji Yasuda, Osaka (JP); Toshikazu Imai, Hyogo (JP); Ryosuke Okawa, Nara (JP); Kazuma Yoshida, Kyoto (JP); Ryou Kato, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/447,100

(22) Filed: Jun. 20, 2019

(65) Prior Publication Data

US 2019/0319126 A1 Oct. 17, 2019

Related U.S. Application Data

(63) Continuation of application No. PCT/JP2017/045908, filed on Dec. 21, 2017.

(Continued)

(51) Int. Cl.
*H01L 23/15* (2006.01)
*H01L 29/78* (2006.01)
*H01L 27/088* (2006.01)

(52) U.S. Cl.
CPC .......... *H01L 29/7827* (2013.01); *H01L 23/15* (2013.01); *H01L 27/088* (2013.01)

(58) Field of Classification Search
CPC ...................................................... H01L 23/15
See application file for complete search history.

(56) References Cited

U.S. PATENT DOCUMENTS 10,340,347 B1 * 7/2019 Yoshida .............. H01L 29/4236
2006/0289930 A1   12/2006 Arai
(Continued)

FOREIGN PATENT DOCUMENTS

JP    2001-127290 A    5/2001
JP    2004-342718 A   12/2004
(Continued)

OTHER PUBLICATIONS

International Search Report issued in Application No. PCT/JP2017/045908 dated Mar. 13, 2018, with English translation.
(Continued)

*Primary Examiner* — Fernando L Toledo
*Assistant Examiner* — Valerie N Newton
(74) *Attorney, Agent, or Firm* — McDermott Will & Emery LLP

(57) ABSTRACT

A semiconductor device includes an N-type semiconductor substrate comprising silicon, an N-type low-concentration impurity layer that is in contact with the upper surface of the N-type semiconductor substrate, a metal layer that is in contact with the entire lower surface of the N-type semiconductor substrate and has a thickness of at least 20 μm, and first and second vertical MOS transistors formed in the low-concentration impurity layer. The ratio of the thickness of the metal layer to the thickness of a semiconductor layer containing the N-type semiconductor substrate and the low-concentration impurity layer is greater than 0.27. The semiconductor device further includes a support comprising a ceramic material and bonded to the entire lower surface of the metal layer only via a bonding layer.

12 Claims, 18 Drawing Sheets

Related U.S. Application Data

(60) Provisional application No. 62/439,343, filed on Dec. 27, 2016.

(56) References Cited

U.S. PATENT DOCUMENTS

| | | | |
|---|---|---|---|
| 2010/0013008 A1 | 1/2010 | Oikawa | |
| 2011/0169103 A1* | 7/2011 | Darwish | H01L 29/7823 257/409 |
| 2015/0115359 A1* | 4/2015 | Tamagawa | H01L 29/0878 257/334 |
| 2015/0357424 A1 | 12/2015 | Kitao | |
| 2017/0213918 A1* | 7/2017 | Sasaki | H01L 29/24 |
| 2019/0229194 A1 | 7/2019 | Yoshida et al. | |
| 2019/0273141 A1 | 9/2019 | Yoshida et al. | |
| 2020/0066852 A1 | 2/2020 | Yoshida et al. | |

FOREIGN PATENT DOCUMENTS

| | | |
|---|---|---|
| JP | 2007-005657 A | 1/2007 |
| JP | 2008-060105 A | 3/2008 |
| JP | 2010-092895 A | 4/2010 |
| JP | 2010-205761 A | 9/2010 |
| JP | 2012182238 A | 9/2012 |
| JP | 5124934 B2 | 1/2013 |
| JP | 2015-231033 A | 12/2015 |
| JP | 2016-86006 A | 5/2016 |
| JP | 2016-134516 A | 7/2016 |
| JP | 2016-197737 A | 11/2016 |

OTHER PUBLICATIONS

J. Oda et al., "Analysis of Stress and Deflection of Printed Plate Board Using Multilayered Beam Theory", Transactions of the Japan Society of Mechanical Engineers (Series A), vol. 59, No. 563 (Jul. 1993), article No. 92-1435, 1993, pp. 1777-1782, with partial English translation.
Notice of Allowance issued in U.S. Appl. No. 16/146,272, dated Feb. 21, 2019.
Non-Final Office Action issued in U.S. Appl. No. 16/418,617, dated Jun. 14, 2019.
Notice of Allowance issued in U.S. Appl. No. 16/418,617, dated Sep. 18, 2019.
Non-Final Office Action issued in U.S. Appl. No. 16/670,805, dated Dec. 16, 2019.
Notice of Allowance issued in U.S. Appl. No. 16/670,805, dated Feb. 6, 2020.

* cited by examiner

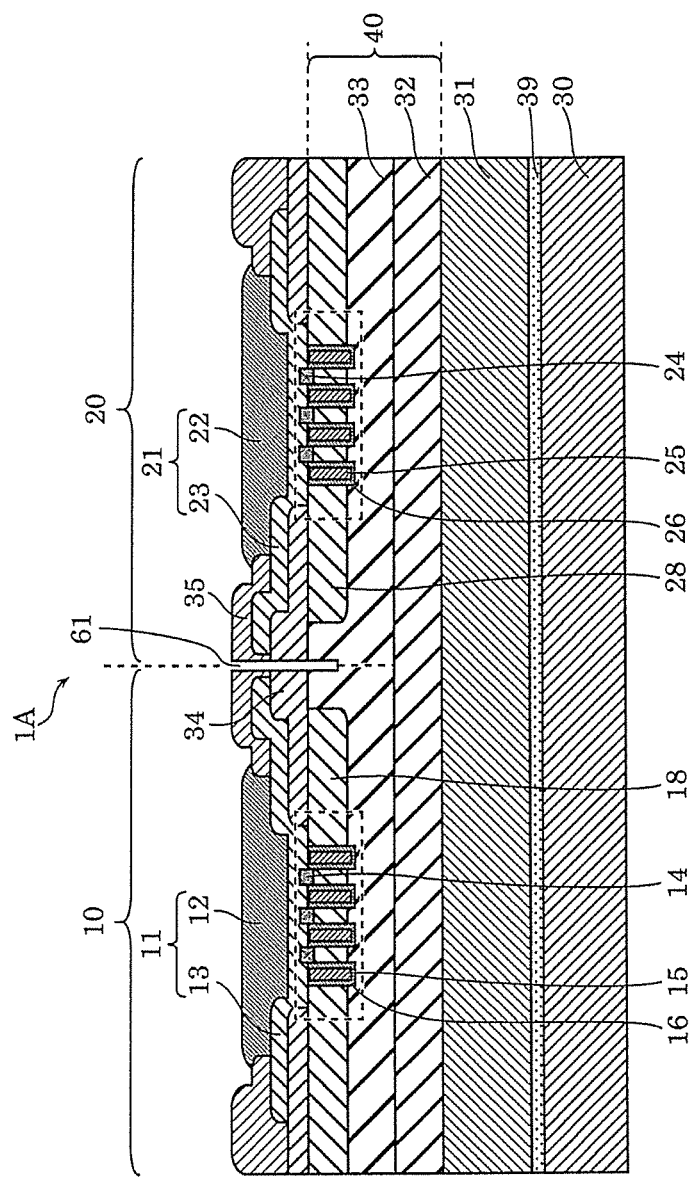

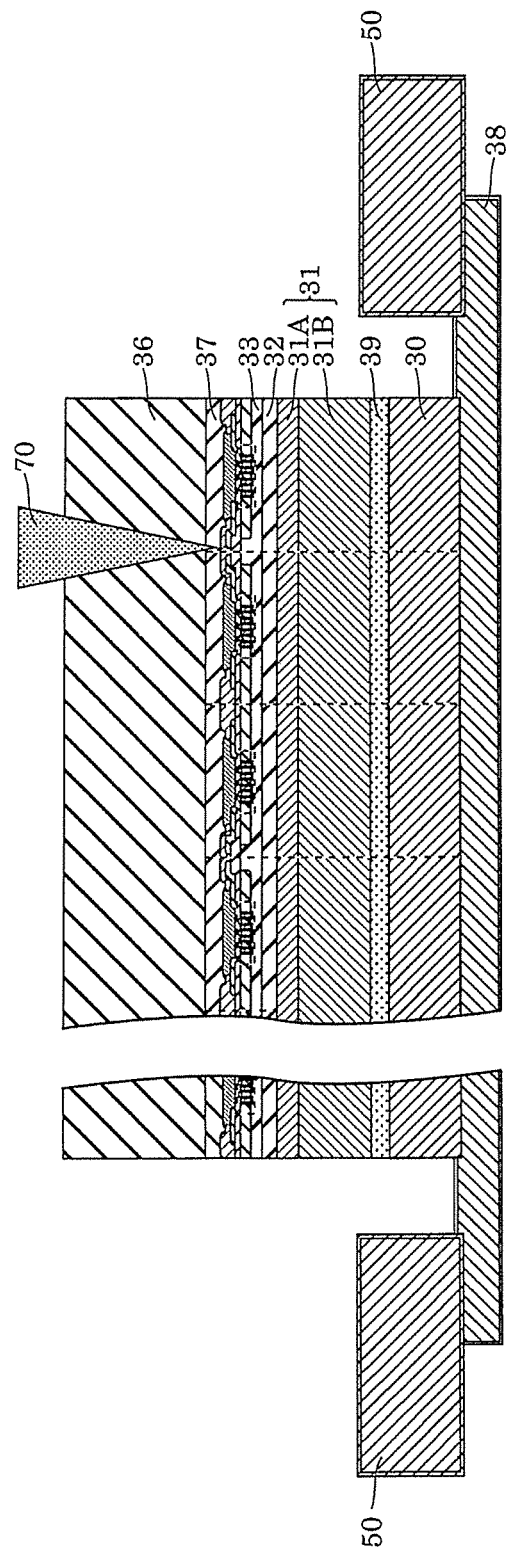

US 10,854,744 B2

SEMICONDUCTOR DEVICE

CROSS REFERENCE TO RELATED APPLICATIONS

This application is a U.S. continuation application of PCT International Patent Application Number PCT/JP2017/045908 filed on Dec. 21, 2017, claiming the benefit of priority of U.S. Provisional Patent Application No. 62/439,343 filed on Dec. 27, 2016, the entire contents of which are hereby incorporated by reference.

BACKGROUND

1. Technical Field

The present disclosure relates to a semiconductor device, and particularly to a chip-size-package-type, facedown-mountable semiconductor device.

2. Description of the Related Art

There has been a proposed semiconductor device including a semiconductor substrate having a first principal surface and a second principal surface, two vertical metal oxide semiconductor (MOS) transistors so provided as to extend from the first principal surface to the second principal surface, and a metal layer formed on the second principal surface. The configuration described above allows not only a horizontal path in the semiconductor substrate but a horizontal path in the metal layer, where the conduction resistance is low, to be used as a path along which current flows from the first transistor to the second transistor, whereby the on-resistance of the semiconductor device can be lowered.

Japanese Unexamined Patent Application Publication No. 2016-86006 proposes a semiconductor device which has the configuration described above and in which a conductive layer is formed on a side of the metal layer that is the side opposite the semiconductor substrate. Japanese Unexamined Patent Application Publication No. 2016-86006 states that the conductive layer can prevent burrs of the metal layer from occurring in the chip singulation step.

Japanese Unexamined Patent Application Publication No. 2012-182238 proposes a semiconductor device which has the configuration described above and in which an insulating coating is formed on a side of the metal layer that is the side opposite the semiconductor substrate. Japanese Unexamined Patent Application Publication No. 2012-182238 states that the insulating coating can prevent scratches, breaks, and other damages with the semiconductor device maintained thin.

SUMMARY

In the semiconductor device disclosed in Patent Literatures 1 and 2, however, the coefficient of thermal expansion of the metal layer is greater than the coefficient of thermal expansion of the semiconductor substrate, and the semiconductor device therefore warps due to a change in the temperature.

In Japanese Unexamined Patent Application Publication No. 2016-86006, in which the conductive layer is formed on a side of the metal layer that is the side opposite the semiconductor substrate, and the conductive layer primarily includes the same metal of which the metal layer, is made, it is not easy from the viewpoint of manufacture to form a conductive layer thick enough to reduce the warpage of the semiconductor device due to a change in the temperature.

In Japanese Unexamined Patent Application Publication No. 2012-182238, in which an insulating coating for reducing the thickness of the semiconductor device and preventing damage of the semiconductor device is formed on a side of the metal layer that is the side opposite the semiconductor substrate, no stress large enough to reduce the warpage of the semiconductor device is induced in the insulating coating in a case where the metal layer has a thickness required to ensure low on-resistance.

That is, the semiconductor devices disclosed in Patent Literatures 1 and 2 cannot lower the on-resistance and suppress warpage of the semiconductor device at the same time.

In view of the fact described above, an object of the present disclosure is to provide a chip-size-package-type semiconductor device that is in a shape of a package having a chip size (hereinafter, referred to also as "chip-size-package-type") and allows both reduction in on-resistance and suppression of warpage.

In order to achieve the above-described object, in accordance with an aspect of the present disclosure, there is provided a semiconductor device being in a shape of a package having a chip size, the semiconductor device that is facedown-mountable, the semiconductor device including: a semiconductor substrate comprising silicon and containing an impurity of a first conductivity type; a low-concentration impurity layer being in contact with an upper surface of the semiconductor substrate and containing the first conductivity type impurity, concentration of which is lower than concentration of the first conductivity type impurity in the semiconductor substrate; a metal layer being in contact with an entire lower surface of the semiconductor substrate and made only of at least one metal material having a thickness of at least 20 µm; a first vertical MOS transistor formed in a first region of the low-concentration impurity layer; and a second vertical metal oxide semiconductor (MOS) transistor formed in a second region of the low-concentration impurity layer, the second region being adjacent to the first region in a direction along the upper surface of the semiconductor substrate. Here, the first vertical MOS transistor has a first source electrode and a first gate electrode, the first source electrode and the first gate electrode being disposed on an upper surface of the low-concentration impurity layer. The second vertical MOS transistor has a second source electrode and a second gate electrode, the second source electrode and the second gate electrode being disposed on the upper surface of the low-concentration impurity layer. The semiconductor substrate functions as a common drain region serving as both a first drain region of the first vertical MOS transistor and a second drain region of the second vertical MOS transistor. A primary current path that is a bidirectional path along which current flows between the first source electrode and the second source electrode via the first drain region, the metal layer, and the second drain region. A ratio of a thickness of the metal layer to a thickness of a semiconductor layer containing the semiconductor substrate and the low-concentration impurity layer is greater than 0.27. The semiconductor device further comprises a support comprising a ceramic material and bonded to an entire lower surface of the metal layer only via a bonding layer. According to the configuration described above, the coefficient of thermal expansion of the semiconductor substrate formed on the upper surface of the metal layer having a thickness that allows low on-resistance to be ensured is balanced with the coefficients of thermal expansion of the bonding layer and the support formed on the lower surface of the metal layer, whereby warpage of the semiconductor device can be suppressed with the on-resistance lowered.

The semiconductor device provided by the present disclosure can be a chip-size-package-type, facedown-mountable semiconductor device that allows both reduction in on-resistance and suppression of warpage of the semiconductor device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 8A is a cross-sectional view of a semiconductor device according to Variation 1 of Embodiment 1;

FIG. 12A is a cross-sectional view showing a sixth step of the method for manufacturing the semiconductor device according to Embodiment 1;

Figure 1A:
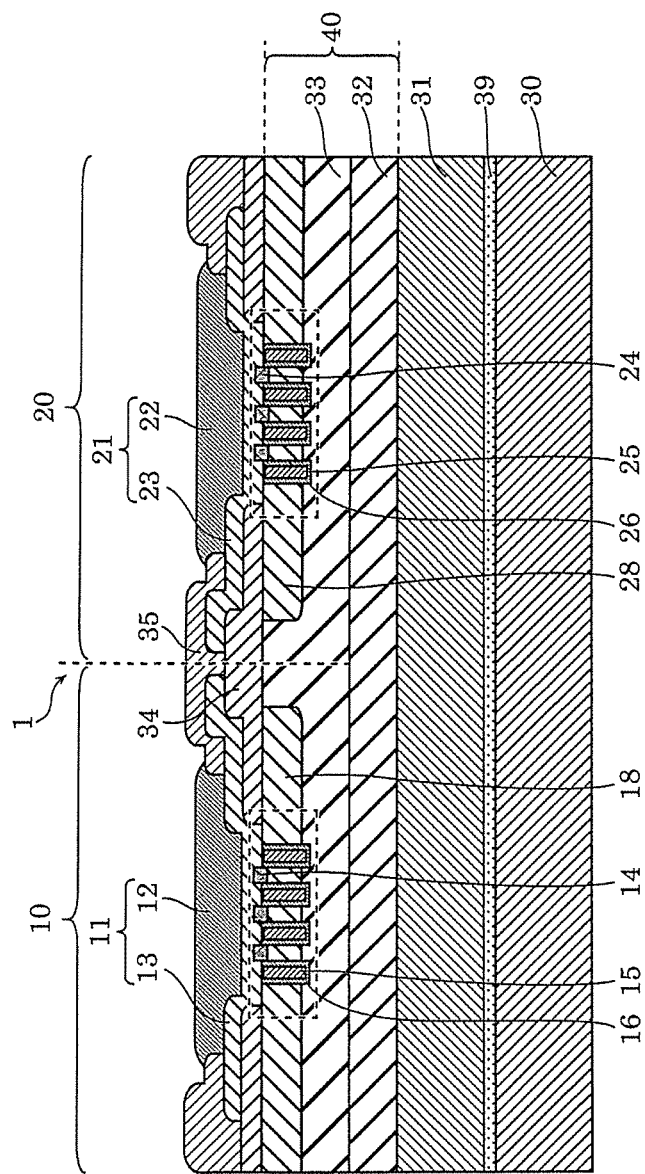
FIG. 1A is a cross-sectional view of a semiconductor device according to Embodiment 1.

DETAILED DESCRIPTION OF THE EMBODIMENTS (Findings on which present disclosure is based) The reduction in the on-resistance and the suppression of the warpage in the semiconductor device including two vertical MOS transistors disclosed in Japanese Unexamined Patent Application Publication No. 2012-182238 will be examined.

In the semiconductor device disclosed in Japanese Unexamined Patent Application Publication No. 2012-182238, on-current flowing through the metal layer flows in the direction parallel to the principal surface of the metal layer. Therefore, from the viewpoint of reduction in on-resistance, a thicker metal layer may be used. According to Japanese Unexamined Patent Application Publication No. 2012-182238, however, from the viewpoint of reduction in warpage of the semiconductor device, an increase in the thickness of the metal layer causes the coefficient of thermal expansion of the metal layer to be a more dominant factor, and Japanese Unexamined Patent Application Publication No. 2012-182238 therefore states that the thickness of the metal layer is preferably one-fourth the thickness of the semiconductor substrate or smaller. In this case, the thickness of the metal layer for reducing the on-resistance is restricted by the thickness of the semiconductor substrate, resulting in a thin metal layer and hence insufficient on-resistance depending on the thickness of the semiconductor substrate.

The insulating coating for prevention of scratches and breaks is formed on a side of the metal layer that is the side opposite the semiconductor substrate. The insulating coating comprises an application-type organic material or formed of a tape comprising an organic material or a thin film comprising an inorganic oxide from the viewpoint of prevention of separation of the coating from the metal layer and reduction in the thickness of the semiconductor device. The insulating coating therefore has the function of suppressing warpage of the semiconductor device resulting from the metal layer, which is, however, a secondary function, and no stress large enough to suppress the warpage of the semiconductor device resulting from the metal layer is induced in the case of a thicker metal layer for reduction in the on-resistance.

In view of the facts described above, the present inventor has conducted intensive studies on a semiconductor device including two vertical MOS transistors, including a metal layer having a thickness of at least 20 μm, and providing practically low on-resistance when the semiconductor device is used as a charge/discharge circuit and has found a semiconductor device configuration that restricts the amount of warpage of the semiconductor substrate and the metal layer to a predetermined value or smaller.

It should be noted that all the embodiments described below are generic and specific examples of the present disclosure. Numerical values, shapes, materials, constituent elements, arrangement positions and the connection configuration of the constituent elements, and the like described in the following embodiments are merely examples, and are not intended to limit the present disclosure. The present disclosure is characterized by the appended claims. Therefore, among the constituent elements in the following embodiments, constituent elements that are not described in independent claims that show the most generic concept of the present disclosure are described as elements constituting more desirable configurations, although such constituent elements are not necessarily required to achieve the object of the present disclosure.

Embodiment 1

[1. Basic Structure of Semiconductor Device]

Semiconductor device 1 according to the present disclosure will be described below. Semiconductor device 1 according to the present disclosure is a chip-size-package-type (CSP-type) multi-transistor chip including two vertical metal oxide semiconductor (MOS) transistors formed in a semiconductor substrate. The two vertical MOS transistors described above are each a power transistor and what is called a trench MOS field effect transistor (FET). It is, however, noted that semiconductor device 1 according to the present embodiment is not used in the opt-electronics field, such as a solid-state imaging device.

Figure 1B:
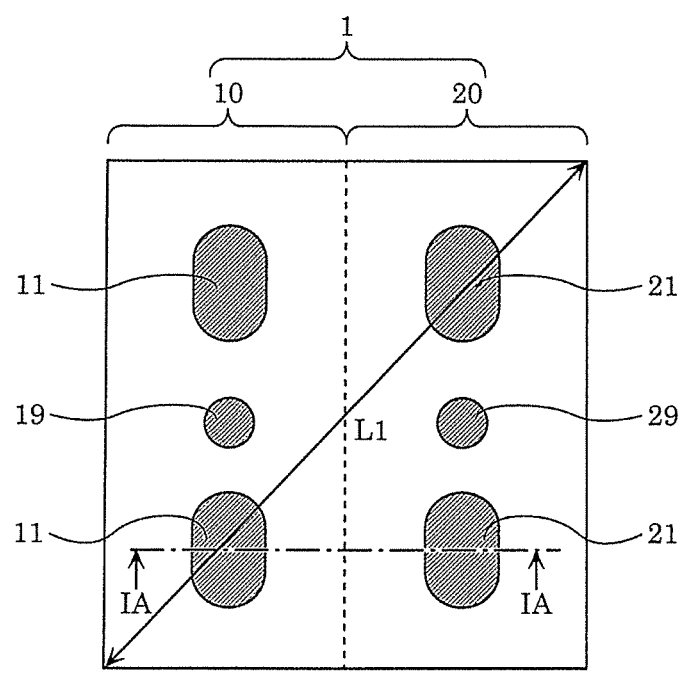
FIG. 1B is a top view showing an example of the electrode configuration of the semiconductor device according to Embodiment 1.

FIG. 1A is a cross-sectional view showing an example of the structure of semiconductor device 1. FIG. 1B is a top view showing an example of the electrode configuration of semiconductor device 1 according to Embodiment 1. The cross-sectional view of FIG. 1A shows the plane taken along the line IA-IA in FIG. 1B. Semiconductor device 1 includes semiconductor substrate 32, low-concentration impurity layer 33, metal layer 31, bonding layer 39, support 30, first vertical MOS transistor 10 (hereinafter referred to as transistor 10), and second vertical MOS transistor 20 (hereinafter referred to as transistor 20), as shown in FIG. 1A. Semiconductor device 1 further includes two first source electrodes 11, two second source electrodes 21, one first gate electrode 19, and one second gate electrode 29 in the plan view of semiconductor substrate 32, as shown in FIG. 1B. The following components are formed in the presented order on the upper surface of transistor 10 along the direction perpendicular to the direction in which transistors 10 and 20 face each other: one of first source electrodes 11; first gate electrode 19; and other first source electrode 11. Further, the following components are formed in the presented order on the upper surface of transistor 20 along the direction perpendicular to the direction in which transistors 10 and 20 face each other: one of second source electrodes 21; second gate electrode 29; and other second source electrode 21.

The number of source electrodes and gate electrodes that form one transistor and the arrangement of the electrodes are not limited to those shown in FIG. 1B.

Semiconductor substrate 32 contains an impurity of a first conductivity type and comprises silicon. Semiconductor substrate 32 is, for example, an N-type silicon substrate.

Low-concentration impurity layer 33 is so formed as to be in contact with the upper surface of semiconductor substrate 32 (upper principal surface in FIG. 1A) and contains the first conductivity type impurity having a concentration lower than the concentration of the first conductivity type impurity in semiconductor substrate 32. Low-concentration impurity layer 33 may be formed on semiconductor substrate 32, for example, in an epitaxial growth process.

The laminate of semiconductor substrate 32 and low-concentration impurity layer 33 is defined as semiconductor layer 40, as shown in FIG. 1A.

Metal layer 31 is so formed as to be in contact with the entire lower surface (lower principal surface in FIG. 1A) of semiconductor substrate 32 and is made only of at least one metal material. As a non-limiting example, metal layer 31 may comprise a metal material containing at least one of silver, copper, gold, and aluminum.

Support 30 is bonded to one of two principal surfaces of metal layer 31 via bonding layer 39 that is the entire lower principal surface that is not in contact with semiconductor substrate 32, and support 30 comprises a ceramic material. An example of the ceramic material that forms support 30 is, in particular, silicon and is instead quartz, sapphire, borosilicate glass, or soda-lime glass.

Bonding layer 39 is a layer so disposed as to be in contact with metal layer 31 and support 30 and used to bond metal layer 31 and support 30 to each other. Bonding layer 39 is formed, for example, of a hardened adhesive comprising an acrylic resin or an epoxy resin or a hardened die attach film (DAF, film adhesive for die bonding).

Transistor 10 is formed in a first region (left-half region in FIG. 1A) of low-concentration impurity layer 33 and includes first source electrodes 11 formed on the upper surface of low-concentration impurity layer 33 and first gate electrode 19 (see FIG. 1B) located in another cross-section.

First body region 18 containing an impurity of a second conductivity type different from the first conductivity type is formed in the first region of low-concentration impurity layer 33. The following components are formed in first body region 18: first source region 14 containing the first conductivity type impurity, first gate conductor 15; and first gate insulating film 16. First source electrode 11 is formed of first section 12 and second section 13, and first section 12 is connected to first source region 14 and first body region 18 via second section 13. First gate electrode 19 is connected to first gate conductor 15.

First section 12 of first source electrode 11 is a layer showing good bondability to a conductive joint material, such as a solder, when the semiconductor device is implemented, and as a non-limiting example, first section 12 may comprise a metal material containing at least one of nickel, titanium, tungsten, and palladium. Gold or any other element may be plated on the surface of first section 12.

Second section 13 of first source electrode 11 is a layer that connects first section 12 to semiconductor layer 40, and as a non-limiting example, second section 13 may comprise a metal material containing at least one of aluminum, copper, gold, and silver.

Transistor 20 is formed in a second region of low-concentration impurity layer 33 that is the region adjacent to the first region in the direction along the upper surface of semiconductor substrate 32 (right-half region in FIG. 1A) and includes second source electrode 21 formed on the upper surface of low-concentration impurity layer 33 and second gate electrode 29 located in another cross-section.

Second body region 28 containing the impurity of the second conductivity type different from the first conductivity type is formed in the second region of low-concentration impurity layer 33. The following components are formed in second body region 28: second source region 24 containing the first conductivity type impurity, second gate conductor 25; and second gate insulating film 26. Second source electrode 21 is formed of first section 22 and second section 23, and first section 22 is connected to second source region 24 and second body region 28 via second section 23. Second gate electrode 29 is connected to second gate conductor 25.

First section 22 of second source electrode 21 is a layer showing good bondability to a conductive joint material, such as a solder, when the semiconductor device is implemented, and as a non-limiting example, first section 22 may comprise a metal material containing at least one of nickel, titanium, tungsten, and palladium. Gold or any other element may be plated on the surface of first section 22.

Second section 23 of second source electrode 21 is a layer that connects first section 22 to semiconductor layer 40, and as a non-limiting example, second section 23 may comprise a metal material containing at least one of aluminum, copper, gold, and silver.

First body region 18 and second body region 28 are covered with inter-layer insulating layer 34 having openings and are provided with second sections 13 and 23 of the source electrodes connected to first source region 14 and second source region 24 via the openings of inter-layer insulating layer 34. Inter-layer insulating layer 34 and second sections 13 and 23 of the source electrodes are covered with passivation layer 35 having openings and are provided with first sections 12 and 22 of the source electrodes connected to second sections 13 and 23 via the openings of passivation layer 35.

In a case where semiconductor device 1 is mounted on a mounting substrate, first source electrodes 11, first gate electrode 19, second source electrodes 21, and second gate electrode 29 are joined in a facedown manner to electrodes provided on the mounting substrate via a conductive bonding material, such as solder. In this case, the greater the warpage of semiconductor device 1, the more unstable the electrical connection of first source electrodes 11, first gate electrode 19, second source electrodes 21, and second gate electrode 29 to the electrodes provided on the mounting substrate. That is, to further stabilize the mounting of semiconductor device 1 on the mounting substrate, the warpage of semiconductor device 1 needs to be smaller.

The above configurations of transistors 10 and 20 allow semiconductor substrate 32 to act as a common drain region serving as both the first drain region of transistor 10 and the second drain region of transistor 20. In semiconductor device 1, a bidirectional path along which current flows between first source electrodes 11 and second source electrodes 21 via the first drain region, metal layer 31, and the second drain region is called a primary current path.

Figure 2A:
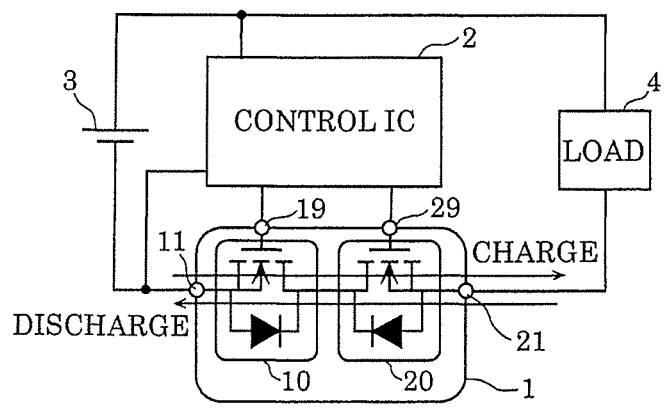
FIG. 2A is a circuit diagram showing a first application of the semiconductor device according to Embodiment 1 to a charge/discharge circuit.

FIG. 2A is a circuit diagram showing a first application of semiconductor device 1 to a charge/discharge circuit. Semiconductor device 1 controls discharge from battery 3 to load 4 and charge from load 4 to battery 3 in accordance with a control signal provided from control IC2, as shown in FIG. 2A.

Figure 2B:
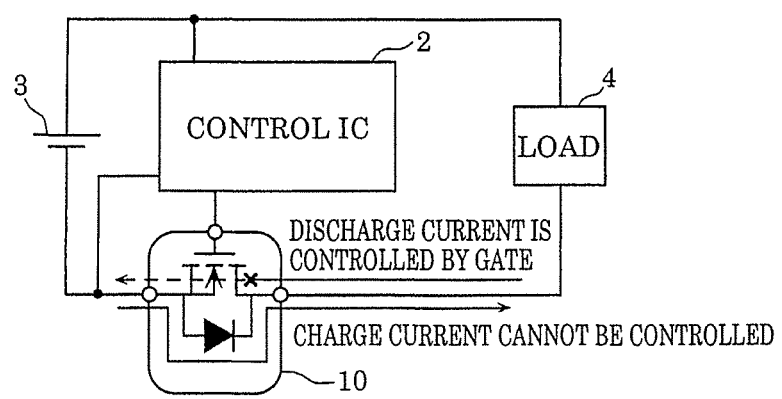
FIG. 2B is a circuit diagram in a case where the application to the charge/discharge circuit is formed only of a unidirectional transistor.

FIG. 2B is a circuit diagram in a case where the same application is formed only of unidirectional transistor 10. The discharge current can be stopped by turning off transistor 10, but the charge current cannot be stopped by turning off transistor 10 because the charge current flows through a body diode formed between first body region 18 and low-concentration impurity layer 33 in the forward direction (direction from first body region 18 to low-concentration impurity layer 33), as shown in FIG. 2B. To allow complete current blockade both in the discharge and charge, a bidirectional transistor is required.

Figure 2C:
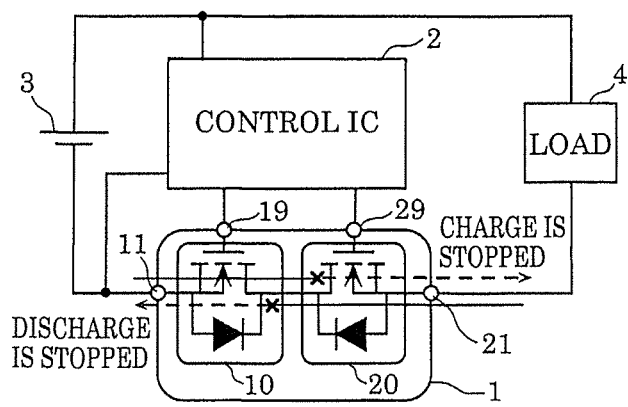
FIG. 2C is a circuit diagram showing a second application of the semiconductor device according to Embodiment 1 to the charge/discharge circuit.

FIG. 2C is a circuit diagram showing a second application of semiconductor device 1 to the charge/discharge circuit. Semiconductor device 1 blocks the discharge current by turning off transistor 10 and blocks the charge current by turning off transistor 20 in accordance with a control signal provided from control IC2, as shown in FIG. 2C.

In semiconductor device 1 shown in FIG. 1A, assuming, for example, that the first conductivity type is the N type and the second conductivity type is the P type, first source region 14, second source region 24, semiconductor substrate 32, and low-concentration impurity layer 33 may comprise an N-type semiconductor, and first body region 18 and second body region 28 may comprise a P-type semiconductor.

Instead, assuming, for example, that the first conductivity type is the P type and the second conductivity type is the N type, first source region 14, second source region 24, semiconductor substrate 32, and low-concentration impurity layer 33 may comprise a P-type semiconductor, and first body region 18 and second body region 28 may comprise an N-type semiconductor.

The following description will be made of a case where semiconductor device 1 shown in FIG. 1A is what is called an N-channel transistor with the first conductivity type being the N type and the second conductivity type being the P type unless otherwise noted.

The on state of semiconductor device 1 will first be described.

In semiconductor device 1 shown in FIG. 1A, when high voltage is applied to first source electrodes 11, low voltage is applied to second source electrodes 21, and voltage higher than or equal to a threshold is applied to first gate electrode 19 (first gate conductor 15) and second gate electrode 29 (second gate conductor 25) with respect to second source electrodes 21 as a reference, a channel is formed in the vicinity of first gate insulating film 16 and second gate insulating film 26, and current flows along the path from first source electrodes 11→first body region 18→the first drain region→metal layer 31→the second drain region→second body region 28 to second source electrodes 21.

The current described above is the charge current in FIG. 2A, and the state described above is the on state of semiconductor device 1 in which transistors 10 and 20 conduct on-current.

The on-current between transistors 10 and 20 flows through metal layer 31. Therefore, increasing the thickness of metal layer 31 increases the cross-sectional area of the on-current path, and the on-resistance of semiconductor device 1 decreases accordingly.

The off state of semiconductor device 1 will next be described.

In FIG. 1A, the PN junction between first body region 18 and low-concentration impurity layer 33 and the PN junction between second body region 28 and low-concentration impurity layer 33 each form a body diode. In the following description, the body diode formed between first body region 18 and low-concentration impurity layer 33 is referred to as a first body diode, and the body diode formed between second body region 28 and low-concentration impurity layer 33 is referred to as a second body diode.

In FIG. 1A, when the voltage at second gate electrode 29 (second gate conductor 25) is lower than the threshold with respect to second source electrodes 21 as a reference, no channel is formed in the vicinity of gate insulating film 26 even when the high voltage is applied to first source electrodes 11 and the low voltage is applied to second source electrodes 21, resulting in the off-state, in which no on-current flows. At this point, since transistor 10 is biased in the forward direction of the first body diode, transistor 10 conducts current irrespective of the voltage applied to first gate electrode 19 (first gate conductor 15).

Also in a case where the high voltage is applied to second source electrodes 21 and the low voltage is applied to first source electrodes 11 in the reverse voltage application condition under which voltage is applied to first source electrodes 11 and second source electrodes 21, no channel is formed in the vicinity of gate insulating film 16 of transistor 10 when the voltage at first gate electrode 19 (first gate conductor 15) is lower than a threshold with respect to first source electrodes 11 as a reference, resulting in the off-state of semiconductor device 1 in which no on-current flows. [2. Basic structure for reducing on-resistance of semiconductor device] A description will be made of a basic configuration for reducing the on-resistance of semiconductor device 1 according to the present embodiment.

Figure 3A:
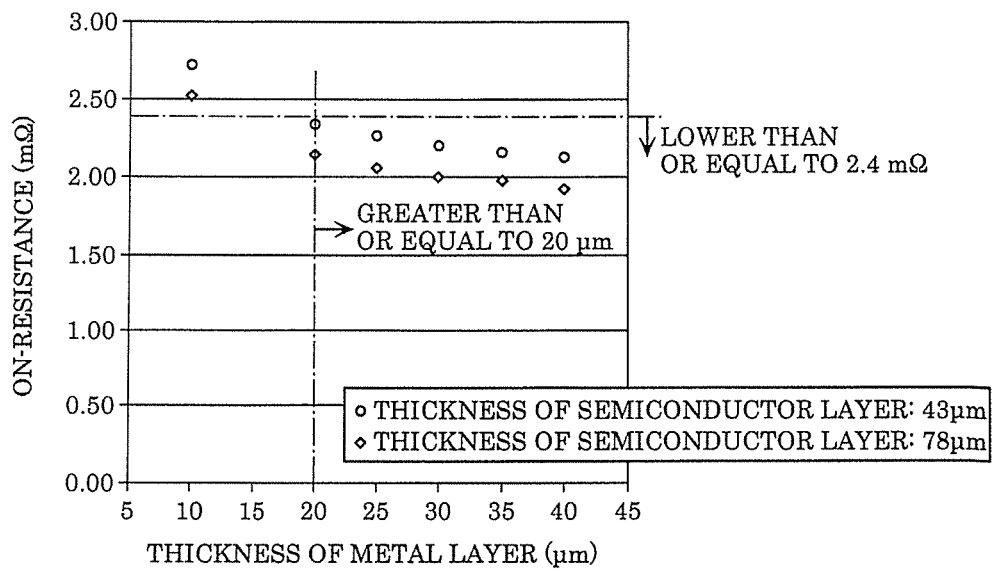
FIG. 3A is a graph showing on-resistance versus the thickness of a metal layer in a semiconductor device according to Comparative Example 1.

FIG. 3A is a graph showing the on-resistance versus the thickness of the metal layer in a semiconductor device according to Comparative Example 1.

The semiconductor device according to Comparative Example 1 has a configuration in which no bonding layer 39 or support 30 is formed, unlike semiconductor device 1 shown in FIGS. 1A and 1B. In the semiconductor device according to Comparative Example 1, it was assumed that (1) semiconductor layer 40 has a thickness of 43 μm and (2) semiconductor layer 40 has a thickness of 78 μm, and the on-resistance of the semiconductor device was measured with the thickness of metal layer 31 changed over a range from 10 μm to 40 μm. The on-resistance was measured on a sample basis by using a first method for measuring the on-resistance with a sample mounted on an evaluation substrate and a second method for measuring the on-resistance with a probe in contact with a sample in the form of a bare chip. A difference in measured value that occurs due to the difference in the measurement method was corrected as appropriate.

Table 1 shows parameters of the semiconductor device according to Comparative Example 1.

TABLE 1

| Parameters | Numerical range |
| --- | --- |
| Thickness of semiconductor layer 40 (μm) | 43,78 |
| Thickness of metal layer 31 (Ag: μm) | 10-40 |
| Thickness of low-concentration impurity layer 33 (μm) | 2.75 |
| Diagonal length L1 (mm) | 3.92 |
| Thickness of metal layer 31/thickness of semiconductor layer 40 | 0.13-0.93 |

The on-resistance decreases as the thickness of metal layer 31 increases, as shown in FIG. 3A.

In a case where the semiconductor device according to the present disclosure is used as a charge/discharge circuit that charges and discharges a smartphone and a tablet, the on-resistance is required to be lower than or equal to 2.2 mΩ to 2.4 mΩ as a 20-V withstand voltage specification due to a short charge period, rapid charging, and other restrictions.

FIG. 3A shows that metal layer 31 needs to be at least 20 μm in thickness to achieve on-resistance lower than or equal to 2.4 mΩ.

Figure 3B:
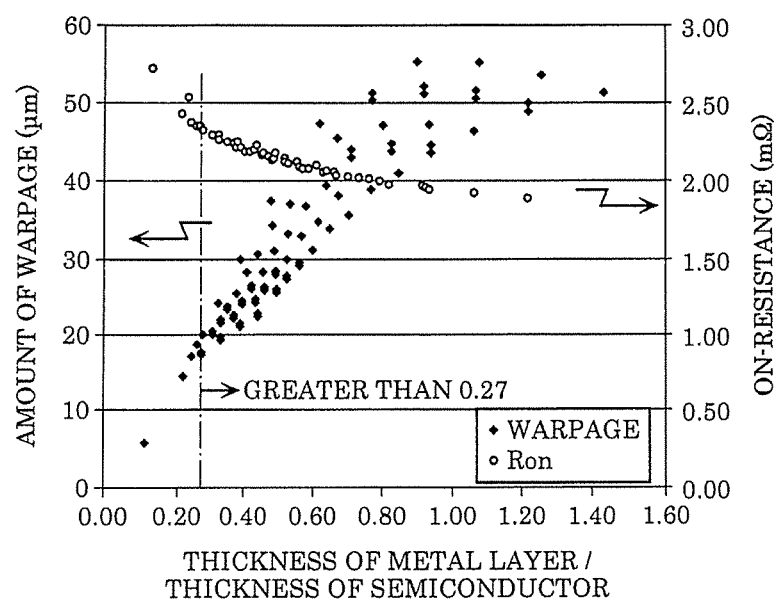
FIG. 3B is a graph showing the on-resistance and the amount of warpage versus the thickness of the metal layer/the thickness of a semiconductor layer in a semiconductor device according to Comparative Example 2.

FIG. 3B is a graph showing the relationship among a ratio of the thickness of metal layer 31 to the thickness of semiconductor layer 40 (hereinafter referred to as thickness of metal layer 31/thickness of semiconductor layer 40 in some cases), the on-resistance, and the amount of warpage in a semiconductor device according to Comparative Example 2. The semiconductor device according to Comparative Example 2 has a configuration in which no bonding layer 39 or support 30 is formed, unlike semiconductor device 1 shown in FIGS. 1A and 1B. In the semiconductor device according to Comparative Example 2, the on-resistance and the amount of warpage of the laminate of semiconductor substrate 32 and metal layer 31 were measured with the thickness of metal layer 31 changed over the range from 10 μm to 40 μm and the thickness of semiconductor layer 40 changed over a range from 28 μm to 93 μm. The amount of warpage described above was measured as follows: A sample in the form of a bare chip was caused to undergo a thermal load cycle at a maximum temperature of 250° C., which mimics reflow soldering; the shape of the bare chip was measured by using a Moire method; and the amount of maximum measured warpage was recorded.

Table 2 shows parameters of the semiconductor device according to Comparative Example 2.

TABLE 2

| Parameters | Numerical range |
| --- | --- |
| Thickness of semiconductor layer 40(μm) | 28-93 |
| Thickness of metal layer 31 (Ag: μm) | 10-40 |
| Thickness of low-concentration impurity layer 33 (μm) | 2.75 |
| Diagonal length L1 (mm) | 3.92 |
| Thickness of metal layer 31/Thickness of semiconductor layer 40 | 0.11-1.43 |

The on-resistance decreases as the thickness of metal layer 31/thickness of semiconductor layer 40 increases, as shown in FIG. 3B. On the other hand, the amount of warpage increases as the thickness of metal layer 31/the thickness of semiconductor layer 40 increases.

FIG. 3B shows that the thickness of metal layer 31/the thickness of semiconductor layer 40 needs to be greater than 0.27 to achieve the on-resistance lower than or equal to 2.4 mΩ. When the thickness of metal layer 31/the thickness of semiconductor layer 40 is greater than 0.27, however, the amount of warpage is greater than or equal to 20 μm. As the amount of warpage increases, it is difficult to stably face-down-mount the semiconductor device on the mounting substrate, resulting in failure of the facedown-mounting. Examples of the failure include (1) incomplete solder bonding between the electrodes on the semiconductor device and the electrodes on the mounting substrate, (2) creation of voids in the solder, and (3) an inter-electrode short circuit due to the solder extending off the electrodes.

That is, in the semiconductor devices according to Comparative Examples 1 and 2, to satisfy the on-resistance of 2.4 mΩ or smaller necessary for the charge/discharge circuit, (1)

the thickness of metal layer 31 needs to be at least 20 μm and (2) the thickness of metal layer 31/the thickness of semiconductor layer 40 needs to be greater than 0.27. When (1) and (2) described above are satisfied, however, the amount of warpage of at least 20 μm and other problems occur.

[3. Structure that Reduces Both on-Resistance and Warpage of Semiconductor Device]

Unlike the semiconductor devices according to Comparative Examples 1 and 2 described above, semiconductor device 1 according to the present embodiment is configured as follows: Bonding layer 39 is so formed as to be in contact with an entire principal surface of metal layer 31 that is the principal surface opposite semiconductor substrate 32; and support 30 comprising a ceramic material is so formed as to be in contact with an entire principal surface of bonding layer 39 that is the principal surface opposite metal layer 31.

The coefficient of thermal expansion, Young's modulus, and other physical constants that primarily induce stress in support 30 comprising a ceramic material are closer to the above physical constants of semiconductor substrate 32 than to the above physical constants of metal layer 31 comprising a metal material. That is, thermal expansion stress that cancels thermal expansion stress induced by the bonding between semiconductor substrate 32 and metal layer 31 is induced by the bonding between support 30 and metal layer 31. Since equilibrium of the thermal expansion stress is thus achieved at the principal surfaces of metal layer 31 that face away from each other, warpage of the laminate of metal layer 31 and semiconductor layer 40 can be suppressed.

In contrast, in the semiconductor device described in Japanese Unexamined Patent Application Publication No. 2016-86006, a conductive layer is so formed as to be in contact with a principal surface of the metal layer that is the principal surface opposite the semiconductor substrate. The above physical constants of the conductive layer are closer to the above physical constants of the metal layer than to the above physical constants of the semiconductor substrate. Therefore, in the semiconductor device described in Japanese Unexamined Patent Application Publication No. 2016-86006, the bonding between the conductive layer and the metal layer induces no stress that cancels the stress induced by the bonding between the semiconductor substrate and the metal layer.

In semiconductor device 1 according to the present embodiment, to form support 30 for suppressing the thermal expansion stress induced in metal layer 31 having a thickness of at least 20 μm with the ratio of the thickness of metal layer 31 to the thickness of semiconductor layer 40 being greater than 0.27, a thin-film material, such as the insulating coating disclosed in Japanese Unexamined Patent Application Publication No. 2012-182238 (application-type organic material, tape comprising organic material, thin film comprising inorganic oxide), is insufficient. In contrast, as support 30 for suppressing the thermal expansion stress induced in metal layer 31 having a thickness of at least 20 μm with the ratio of the thickness of metal layer 31 to the thickness of semiconductor layer 40 being greater than 0.27, it is practically difficult to directly attach to metal layer 31 ceramic support 30 having a coefficient of thermal expansion and Young's modulus relatively close to those of semiconductor layer 40. Therefore, semiconductor device 1 according to the present embodiment is so configured that bonding layer 39 is interposed between metal layer 31 and support 30.

As a result, to suppress the thermal expansion stress induced in metal layer 31 having a thickness of at least 20 μm with the ratio of the thickness of metal layer 31 to the thickness of semiconductor layer 40 being greater than 0.27, bonding layer 39 and ceramic support 30 are formed on a side of metal layer 31 that is the side opposite semiconductor substrate 32, whereby chip-size-package-type semiconductor device 1, which allows both reduction in the on-resistance and suppression of warpage of semiconductor device 1, can be provided.

The ceramic material of support 30 is, for example, silicon. The cutting processability in the singulation of the semiconductor device in a dicing process is therefore improved as compared with a case where support 30 comprises a silicon nitride or a silicon oxide. Further, silicon is more readily available and more inexpensive than a silicon nitride and a silicon oxide.

The metal material of metal layer 31 is, for example, silver (Ag). The on-resistance can therefore be effectively reduced as compared, for example, with copper (Cu) typically used as a metal material.

In semiconductor device 1 according to the present embodiment, metal layer 31 may be thicker than semiconductor layer 40. The configuration described above can contribute to further reduction in the on-resistance.

Support 30 may be thinner than semiconductor layer 40. The configuration of semiconductor device 1 according to the present embodiment, in which bonding layer 39 is interposed between metal layer 31 and support 30, can contribute to reduce the amount of warpage of semiconductor substrate 32 and metal layer 31 even in the case where support 30 is thinner than semiconductor layer 40.

Bonding layer 39 may be a conductive adhesive, and the conductive adhesive may, for example, be a conductive DAF. The material of the conductive adhesive may be silver paste. Such a material can contribute to further reduction in the on-resistance. [4. Optimization of thickness of each layer that forms semiconductor device]A description will comprise the process of optimizing the thickness of each layer to reduce the on-resistance and warpage of semiconductor device 1 according to the present embodiment.

First, a theoretical formula that derives the amount of warpage that occurs in a case where multiple layers having different physical constants are attached to each other (equation derived from multilayered beam theory) is applied to semiconductor device 1 according to the present embodiment formed of four layers, semiconductor layer 40, metal layer 31, bonding layer 39, and support 30 (step S10).

The theoretical equation described above is then so fit that the amount of warpage δ of semiconductor device 1 according to the present embodiment derived based on the theoretical equation described above accords with a value calculated by a warpage calculation simulator constructed by using a finite element method (step S20).

Finally, the theoretical formula described above and an equation of calculating the effective amount of warpage δe derived from the warpage calculation simulator are used to derive the thicknesses of bonding layer 39 and support 30 in the case where the amount of warpage δe of semiconductor device 1 according to the present embodiment is smaller than or equal to 20 μm and 40 m (step S30).

Step S10 described above will first be described.

Figure 4A:
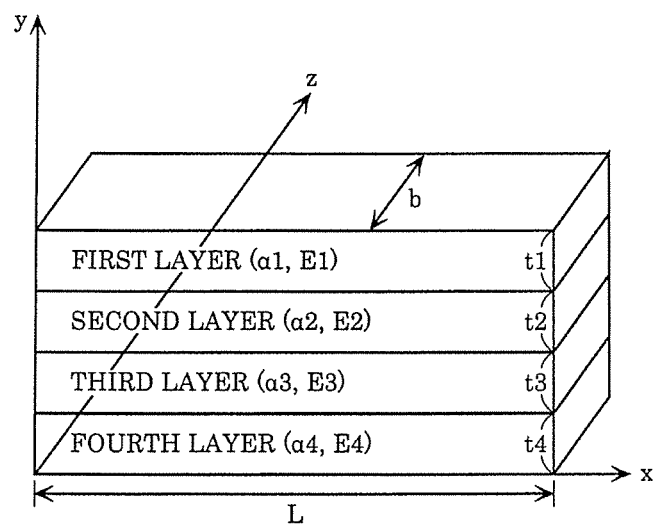
FIG. 4A shows a basic model for deriving the warpage of a multilayered body.

FIG. 4A shows a basic model for deriving the amount of warpage of a multilayered body. A first layer having (coefficient of thermal expansion $\alpha_1$, Young's modulus $E_1$) and thickness $t_1$, a second layer having (coefficient of thermal expansion $\alpha_2$, Young's modulus $E_2$) and thickness $t_2$, a third layer having (coefficient of thermal expansion $\alpha_3$, Young's modulus $E_3$) and thickness $t_3$, and a fourth layer having (coefficient of thermal expansion $\alpha_4$, Young's modulus $E_4$)

and thickness $t_4$ are joined to each other in the present order in the direction toward the negative side of the axis y, as shown in FIG. 4A. It is assumed that the four layers have the same length L and the width (depth) b when viewed along the axis-y direction.

Figure 4B:
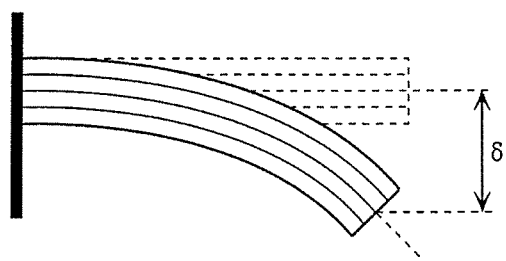
FIG. 4B is a schematic side view for describing the amount of warpage δ of a multilayered body.
Figure 4B:
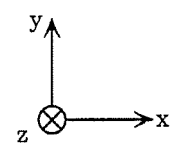

FIG. 4B is a schematic side view for describing the amount of warpage δ of the multilayered body. The amount of shift of an end portion of the multilayered body that is the end portion on the positive side of the axis x shifted toward the negative side of the axis y from the horizontal position of the end portion due to the stress induced in the multilayered body is defined as the amount of warpage δ, as shown in FIG. 4B.

The amount of warpage δ of the multilayered model shown in FIG. 4A is expressed by following Expression 1 based on the multilayered beam theory described in Non-Japanese Unexamined Patent Application Publication No. 2016-86006 (JUHACHI ODA, "Analysis of Stress and Deflection of Printed Plate Board Using Multilayered Beam Theory," Transactions of the Japan Society of Mechanical Engineers Series A, pp. 1777-1782, 1993). R in Expression 1 is expressed by Expression 2.

$$\delta = \frac{L^2}{2R} \quad \text{(Expression 1)}$$

$$R = \frac{F}{G} \quad \text{(Expression 2)}$$

$$F = 4X_0 Y + K_{12}X_{12} + K_{13}X_{13} + K_{23}X_{23} + K_{14}X_{14} + K_{24}X_{24} + K_{34}X_{34}$$

$$G = 2\Delta T\{(\alpha_1 - \alpha_2)X_{12} + (\alpha_1 - \alpha_3)X_{13} + (\alpha_2 - \alpha_3)X_{23} + (\alpha_1 - \alpha_4)X_{14} + (\alpha_2 - \alpha_4)X_{24} + (\alpha_3 - \alpha_4)X_{34}\}$$

$$Y = E_1 I_1 + E_2 I_2 + E_3 I_3 + E_4 I_4$$

$$I_1 = \frac{b \cdot t_1^3}{12}, I_2 = \frac{b \cdot t_2^3}{12}, I_3 = \frac{b \cdot t_3^3}{12}, I_4 = \frac{b \cdot t_4^3}{12}$$

$$X_0 = t_1 E_1 + t_2 E_2 + t_3 E_3 + t_4 E_4$$

$$X_{12} = K_{12} t_1 t_2 E_1 E_2, X_{13} = K_{13} t_1 t_3 E_1 E_3,$$
$$X_{23} = K_{23} t_2 t_3 E_2 E_3$$

$$X_{14} = K_{14} t_1 t_4 E_1 E_4, X_{24} = K_{24} t_2 t_4 E_2 E_4,$$
$$X_{34} = K_{34} t_3 t_4 E_3 E_4$$

$$K_{12} = t_1 + t_2, K_{13} = t_1 + t_3 + 2t_2, K_{23} = t_2 + t_3$$

$$K_{14} = t_1 + t_4 + 2(t_2 + t_3), K_{24} = t_2 + t_4 + 2t_3,$$
$$K_{34} = t_3 + t_4$$

The amount of warpage δ can be expressed in the form of a function of the thickness $t_n$ (n=1 to 4) of each of the layers based on Expressions 1 and 2, and other parameters that determine the function are the length L of each of the layers, a change in the temperature ΔT, and ($\alpha_n$, $E_n$) of each of the layers (n=1 to 4).

Table 3 shows an example of the amount of warpage δ determined by using Expressions 1 and 2 described above. Table 4 shows the other parameters used when the amounts of warpage δ in Table 3 are determined.

TABLE 3

| Thickness of each layer (µm) | | | | F | G | R | Amount of warpage δ (µm) |
|---|---|---|---|---|---|---|---|
| t1 | t2 | t3 | t4 | | | | |
| 20 | 30 | 30 | 0 | 2.11E+10 | −9.87E+11 | −0.02 | 181.2 |
| 20 | 30 | 30 | 50 | 1.73E+12 | 5.26E+12 | 0.33 | −11.8 |
| 20 | 30 | 30 | 100 | 6.78E+12 | 1.61E+13 | 0.42 | −9.2 |
| 20 | 30 | 30 | 150 | 1.89E+13 | 3.14E+13 | 0.60 | −6.4 |
| 20 | 50 | 30 | 0 | 6.64E+10 | −2.20E+12 | −0.03 | 128.2 |
| 20 | 50 | 30 | 50 | 2.74E+12 | 9.52E+12 | 0.29 | −13.5 |
| 20 | 50 | 30 | 100 | 9.49E+12 | 2.87E+13 | 0.33 | −11.7 |
| 20 | 50 | 30 | 150 | 2.42E+13 | 5.53E+13 | 0.44 | −8.8 |
| 20 | 30 | 50 | 0 | 2.37E+10 | −1.11E+12 | −0.02 | 181.8 |
| 20 | 30 | 50 | 50 | 2.53E+12 | 7.07E+12 | 0.36 | −10.8 |
| 20 | 30 | 50 | 100 | 8.78E+12 | 2.00E+13 | 0.44 | −8.8 |
| 20 | 30 | 50 | 150 | 2.25E+13 | 3.76E+13 | 0.60 | −6.5 |
| 20 | 50 | 50 | 0 | 7.07E+10 | −2.36E+12 | −0.03 | 129.5 |
| 20 | 50 | 50 | 50 | 3.81E+12 | 1.24E+12 | 0.31 | −12.7 |
| 20 | 50 | 50 | 100 | 1.21E+12 | 3.49E+13 | 0.35 | −11.1 |
| 20 | 50 | 50 | 150 | 2.89E+13 | 6.49E+13 | 0.45 | −8.7 |
| 20 | 30 | 100 | 50 | 5.24E+12 | 1.18E+13 | 0.45 | −8.7 |
| 20 | 30 | 100 | 100 | 1.52E+12 | 3.02E+13 | 0.50 | −7.7 |
| 20 | 50 | 100 | 50 | 7.35E+12 | 1.99E+13 | 0.37 | −10.5 |
| 20 | 50 | 100 | 100 | 2.04E+13 | 5.07E+13 | 0.40 | −9.6 |

TABLE 4

| | Semi-conductor layer 40 (n = 1) | Metal layer 31 (n = 2) | Bonding layer 39 (n = 3) | Support 30 (n = 4) |
|---|---|---|---|---|
| Length L (mm) | | 3.4 | | |
| Width b (mm) | | 1 | | |
| Coefficient of thermal expansion $\alpha_n$ (ppm/° C.) | 3.35 | 18.5 | 43 | 3.35 |
| Young's modulus $E_n$ (GPa) | 190 | 50 | 1.1 | 190 |
| ΔT(° C.) | | 100 | | |

In Table 4, the width b is 1 mm. The reason for this is that the width b may be arbitrarily set because the width b in the denominator and the width b in the numerator of the equation for calculating the amount of warpage δ are canceled out each other.

Step S20 described above will next be described. In step S20, Expressions 1 and 2 described above are so fit that the amount of warpage δ derived based on Expressions 1 and 2 described above accords with a value δs calculated by the warpage calculation simulator. The warpage calculation simulator used in the fitting is structural analysis software using finite element analysis (manufactured by ANSYS Inc.) and customized by using data on measured warpage of a necessary amount.

The calculated value δs of the amount of warpage obtained by substituting thicknesses $t_1$ to $t_4$ of the layers shown in Table 3 and the parameters shown in Table 4 into the warpage calculation simulator described above can be used to correct the theoretical amount of warpage δ calculated by using Expressions 1 and 2. Specifically, let 3 be the ratio of the amount of warpage δ to the amount of warpage δs (δs/δ), and the amount of warpage δ can be converted into an effective amount of warpage be having fit to the value calculated by the warpage calculation simulator. That is, the effective amount of warpage δe is expressed by following Expression 3 using a fitting coefficient 1.

$$\delta_e = \beta \cdot \delta \quad \text{(Expression 3)}$$

In the data in Table 3, an optimum fitting coefficient β was 0.67.

Step S30 described above will next be described. The equation for calculating the effective amount of warpage δe shown in Expression 3 (hereinafter called effective value calculation equation) derives the thicknesses of bonding layer 39 and support 30 in the case where the amount of warpage of semiconductor device 1 according to the present embodiment is (1) smaller than or equal to 20 μm and (2) smaller than or equal to 40 μm.

Figure 5:
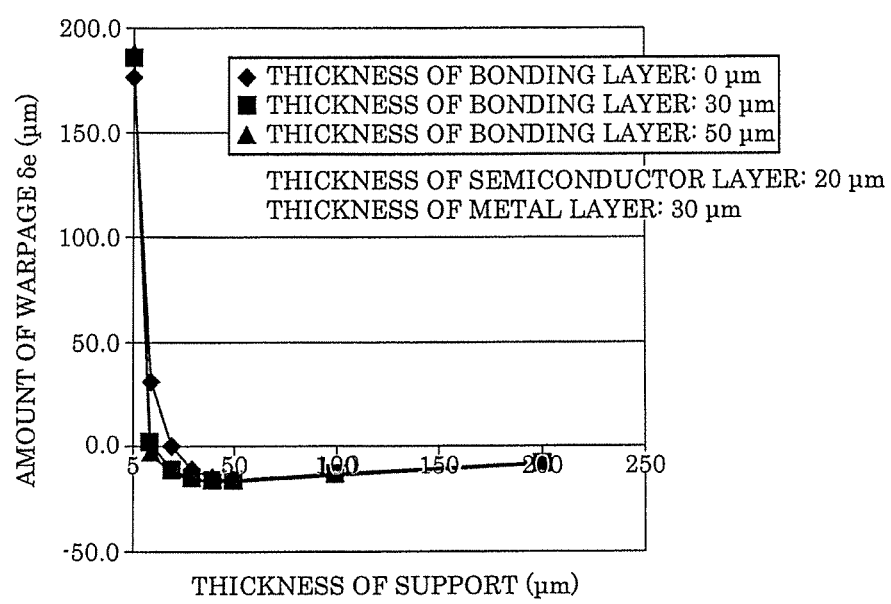
FIG. 5 shows a graph representing the amount of warpage versus the thickness of a bonding layer and the thickness of a support.

FIG. 5 shows a graph representing a change in the amount of warpage δe calculated by using the effective value calculation equation versus the thickness of bonding layer 39 and the thickness of support 30. FIG. 5 shows the relationship between the thickness of support 30 and the amount of warpage δe in a case where the thickness of semiconductor layer 40 and the thickness of metal layer 31 are fixed at 20 μm and 30 μm, respectively, and the thickness of bonding layer 39 is changed to 0, 30, and 50 μm. The other parameters have the values shown in Table 4.

The graph in FIG. 5 allows grasp of the relationship between bonding layer 39 and support 30 that cause the amount of warpage δe to be 20 μm or smaller. FIG. 5 shows the following points:

(1) Thicker bonding layer 39 allows thinner support 30 that causes the amount of warpage δe to be zero. That is, the presence of bonding layer 39 reduces the necessary amount of support 30.

(2) Increasing the thickness of support 30 causes temporary reverse warpage (negative amount of warpage δe), and a further increase in the thickness of support 30 causes the amount of warpage δe to approach zero. The amount of reverse warpage δe has a local minimum of about 10 μm and does not exceed 20 μm. Therefore, to achieve the thicknesses of bonding layer 39 and support 30 describe above, the amount of forward warpage may be 20 μm or smaller.

In the case of the thicknesses of bonding layer 39 and support 30 described above, semiconductor device 1 according to the present embodiment includes the four layers having different physical constant and different thicknesses and therefore has a large number of parameters to be examined.

In view of the fact described above, the thicknesses of bonding layer 39 and support 30 are calculated in accordance with the following strategy:

(1) Primary parameters are the thickness of each of the four layers and the amount of warpage δe. A specification value of the amount of warpage δe is assumed to be a first specification value of 20 μm and a second specification value of 40 μm.

(2) Since the feature of semiconductor device 1 according to the present embodiment is the presence of bonding layer 39 and support 30 for suppression of the warpage of semiconductor layer 40 and metal layer 31, the thickness of support 30 that achieves the specification value of the amount of warpage δe is specified in the form depending on the thickness of bonding layer 39. That is, a function capable of determining the thickness of support 30 is derived in accordance with the thickness of bonding layer 39 to be used.

Figure 6A:
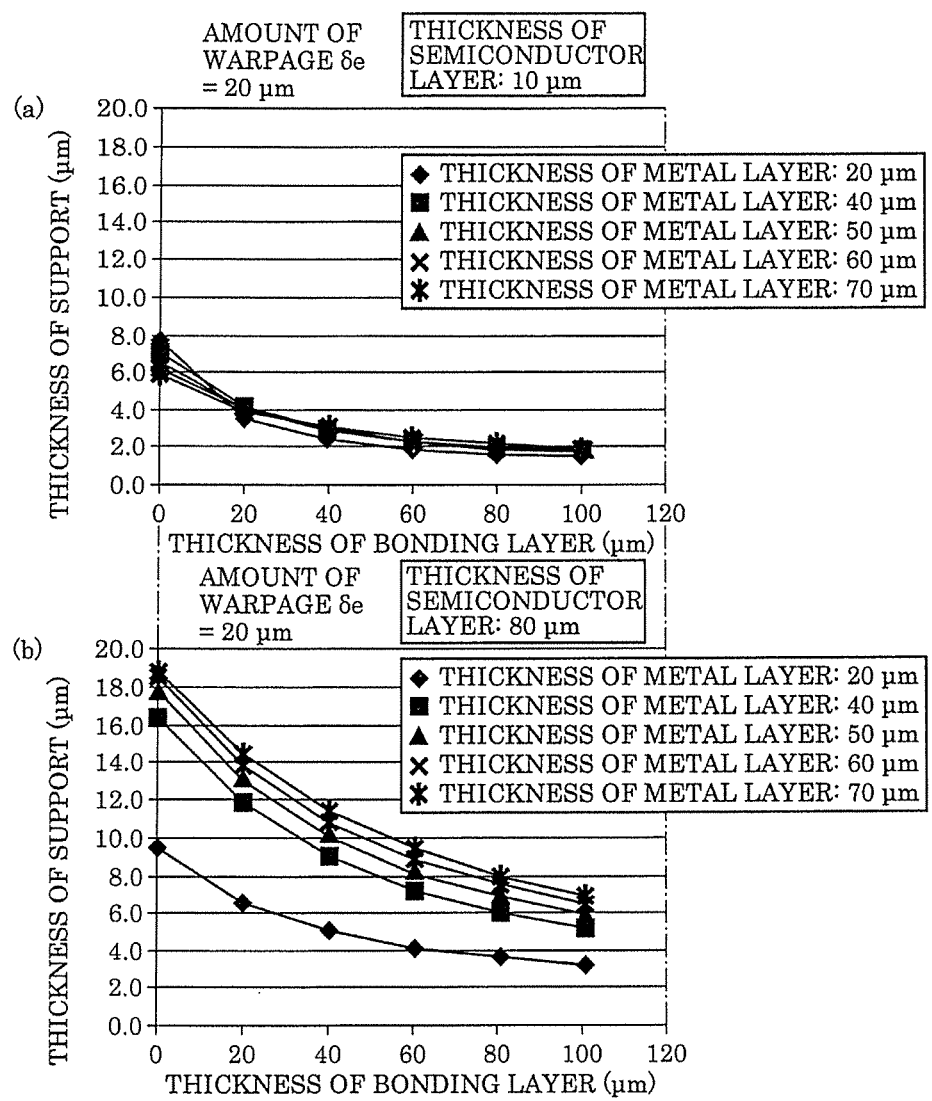
FIG. 6A shows graphs representing the relationship among the thicknesses of the metal layer, the bonding layer, and the support that cause the amount of warpage to be 20 μm calculated by using an effective value calculation equation in a case where the semiconductor layer has a fixed thickness.

FIG. 6A shows graphs representing the relationship among the thicknesses of metal layer 31, bonding layer 39, and support 30 that cause the amount of warpage δe to be 20 μm calculated by using the effective value calculation equation in a case where semiconductor layer 40 has a fixed thickness ((a) semiconductor layer 40 has thickness of 10 μm, (b) semiconductor layer 40 has thickness of 80 μm).

Figure 6B:
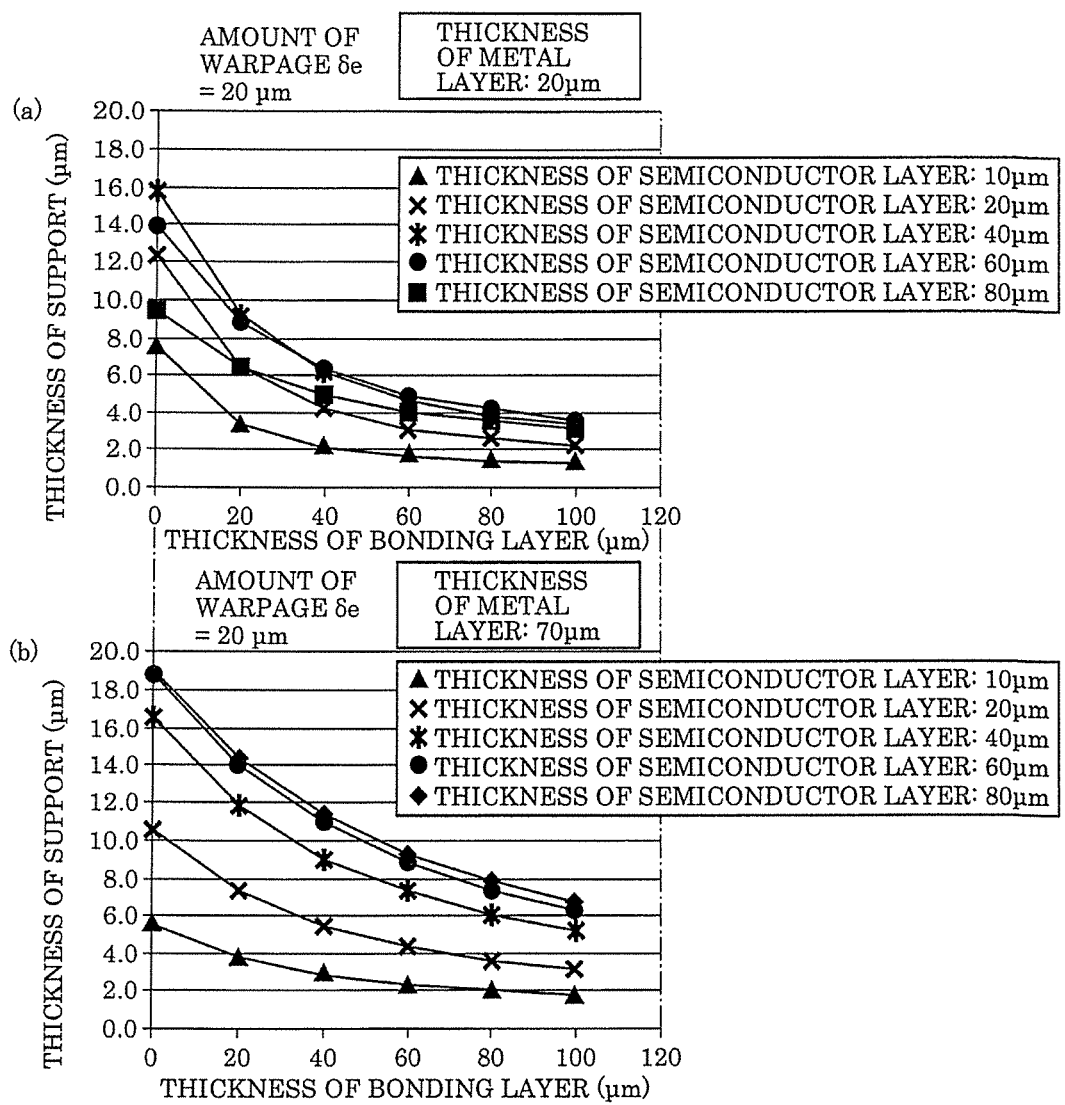
FIG. 6B shows graphs representing the relationship among the thicknesses of the semiconductor layer, the bonding layer, and the support that cause the amount of warpage to be 20 μm calculated by using the effective value calculation equation in a case where the metal layer has a fixed thickness.

FIG. 6B shows graphs representing the relationship among the thicknesses of semiconductor layer 40, bonding layer 39, and support 30 that cause the amount of warpage δe to be 20 μm calculated by using the effective value calculation equation in a case where metal layer 31 has a fixed thickness ((a) metal layer 31 has thickness of 20 μm, (b) metal layer 31 has thickness of 70 μm).

The graphs shown in (a) and (b) of FIG. 6A are acquired by using the effective value calculation equation both in the case where semiconductor layer 40 has the thickness of 20, 40, and 60 μm, and in the case where metal layer 31 has the thickness of 40, 50, and 60 μm. The thus acquired graphs are used to extract the thickness of support 30 for each thickness of bonding layer 39 that causes the amount of warpage δe to be 20 μm. In this process, changes in the thicknesses of semiconductor layer 40 and metal layer 31 change the thickness of support 30 for each thickness of bonding layer 39 that causes the amount of warpage δe to be 20 μm. The maximum of the thicknesses of support 30 obtained by changing the thicknesses of semiconductor layer 40 and metal layer 31 is extracted. The same extraction process is also applied to extraction of the thickness of support 30 for each thickness of bonding layer 39 that causes the amount of warpage δe to be 40 μm.

Table 5 shows combinations of the thickness of support 30 for each thickness of bonding layer 39 acquired in the extraction process. Table 6 shows the other parameters used to determine the amounts of warpage δe in Table 5.

TABLE 5

| Thickness of bonding layer 39 (μm) | Amount of warpage δe = 20 μm (target value) Thickness of support 30 (μm) | Amount of warpage δe = 20 μm (acceptable value) Thickness of support 30 (μm) | Amount of warpage δe = 40 μm (target value) Thickness of support 30 (μm) | Amount of warpage δe = 40 μm (acceptable value) Thickness of support 30 (μm) |
|---|---|---|---|---|
| 0 | 19.0 | 26.2 | 9.4 | 13.1 |
| 20 | 14.4 | 24.3 | 5.9 | 12.1 |
| 40 | 11.4 | 23.2 | 4.3 | 11.8 |
| 60 | 9.4 | 22.5 | 3.3 | 11.5 |
| 80 | 7.9 | 22.0 | 2.7 | 11.4 |
| 100 | 6.8 | 21.7 | 2.3 | 11.3 |

TABLE 6

| | Semiconductor layer 40 (n = 1) | Metal layer 31 (n = 2) | Bonding layer 39 (n = 3) | Support 30 (n = 4) |
|---|---|---|---|---|
| Length L (mm) | | 3.4 (TARGET VALUE) 4.0 (MAXIMUM) | | |
| Width b (mm) | | 1 | | |
| Coefficient of thermal expansion $\alpha_n$ (ppm/° C.) | 3.35 | 18.5 | 1.1 (TARGET VALUE) 5.0 (MAXIMUM) | 3.35 |
| Young's modulus $E_n$ (GPa) | 190 | 75 | 50 (TARGET VALUE) 100 (MAXIMUM) | 190 |
| ΔT(° C.) | | 100 | | |

When a relationship between a thickness of support 30 and a thickness of bonding layer 39 was extracted based on a target value, which was each of the specification values 20 μm and 40 μm of the amount of warpage δe, the respective target values of the parameters in Table 6 were applied to the extraction. On the other hand, when the relationship was extracted based on an applicable value, which was each of the specification values 20 μm and 40 m of the amount of warpage be, the respective maximum values of the parameters in Table 6 were applied to the extraction.

Figure 7:
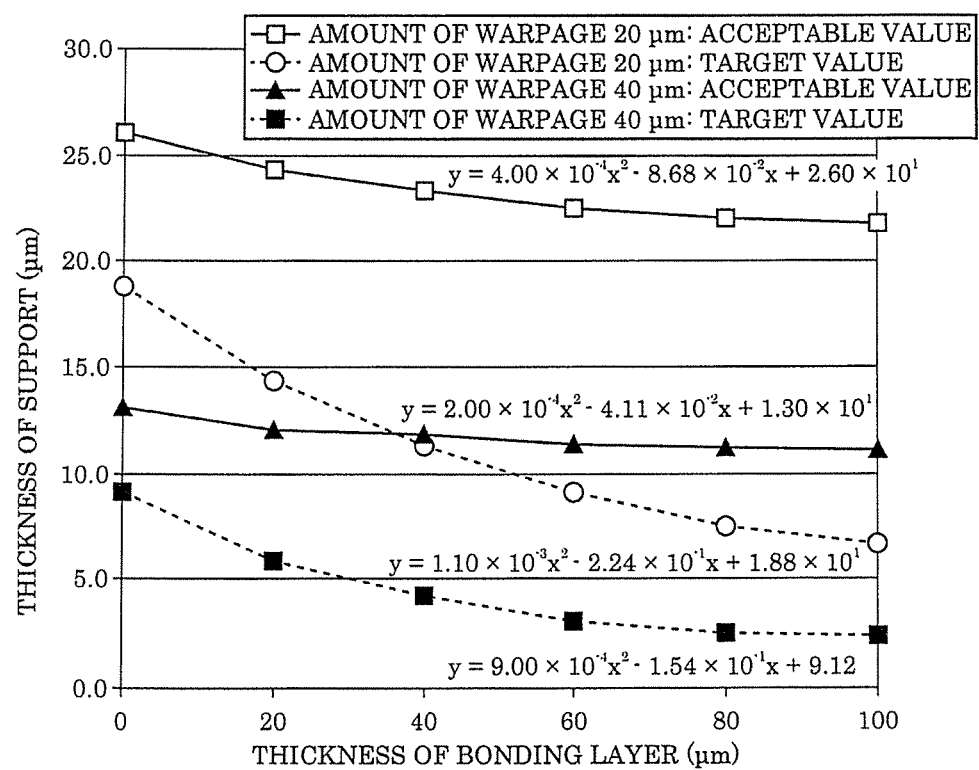
FIG. 7 shows a graph that specifies the relationship of the thickness of the support with the thickness of the bonding layer that causes the amount of warpage to be a target value and an acceptable value in the semiconductor device according to Embodiment 1.

FIG. 7 shows a graph that specifies the relationship of the thickness of support 30 with the thickness of bonding layer 39 that causes the amount of warpage to be 20 μm and 40 μm in semiconductor device 1 according to Embodiment 1. FIG. 7 shows plotted extracted data shown in Table 5. The graph shown in FIG. 7 provides (1) an approximate equation representing the relationship of the thickness of support 30 with the thickness of bonding layer 39 that causes the amount of warpage δe to be 20 μm (target value), (2) an approximate equation representing the relationship of the thickness of support 30 with the thickness of bonding layer 39 that causes the amount of warpage δe to be 20 μm (acceptable value), (3) an approximate equation representing the relationship of the thickness of support 30 with the thickness of bonding layer 39 that causes the amount of warpage δe to be 40 μm (target value), and an approximate equation representing the relationship of the thickness of support 30 with the thickness of bonding layer 39 that causes the amount of warpage δe to be 40 μm (acceptable value). Based on the approximate equations, the relationship of the thickness of support 30 with the thickness of bonding layer 39 that suppresses the amount of warpage of semiconductor device 1 is expressed by Equations 4 to 7.

(1) Let $t_3$ (lm) be the thickness of bonding layer 39 and $t_4$ (m) be the thickness of support 30, and the thickness of support 30 with respect to the thickness of bonding layer 39 that causes the amount of warpage δe to be 20 μm or smaller is expressed by following Equation 4:

$$t_4 \geq 1 \cdot 10 \times 10^{-3} \cdot t_3^2 - 2.24 \times 10^{-1} \cdot t_3 + 1.88 \times 10^1 \qquad \text{(Expression 4)}$$

The amount of warpage of semiconductor device 1 in which the thickness of metal layer 31 is 20 μm and the thickness of metal layer 31/the thickness of semiconductor layer 40 is greater than 0.27 can thus be 20 μm or smaller under the conditions that the length L of each of the layers is 3.4 mm or smaller, the coefficient of thermal expansion $\alpha_3$ of bonding layer 39 is 50 (ppm/° C.) or smaller, and Young's modulus $E_3$ of bonding layer 39 is 1.1 (GPa) or smaller.

(2) Let $t_3$ (min) be the thickness of bonding layer 39 and $t_4$ (μm) be the thickness of support 30, and the thickness of support 30 with respect to the thickness of bonding layer 39 that causes the amount of warpage δe to be 20 μm or smaller is expressed by following Equation 5:

$$t_4 \geq 4.00 \times 10^{-4} \cdot t_3^2 - 8.68 \times 10^{-2} \cdot t_3 + 2.60 \times 10^1 \qquad \text{(Expression 5)}$$

The amount of warpage of semiconductor device 1 in which the thickness of metal layer 31 is 20 μm and the thickness of metal layer 31/the thickness of semiconductor layer 40 is greater than 0.27 can thus be 20 μm or smaller under the conditions that the length L of each of the layers is 4.0 mm or smaller, the coefficient of thermal expansion $\alpha_3$ of bonding layer 39 is 100 (ppm/° C.) or smaller, and Young's modulus $E_3$ of bonding layer 39 is 5.0 (GPa) or smaller.

(3) Let $t_3$ (μm) be the thickness of bonding layer 39 and $t_4$ (μm) be the thickness of support 30, and the thickness of support 30 with respect to the thickness of bonding layer 39 that causes the amount of warpage δe to be 40 μm or smaller is expressed by following Equation 6:

$$t_4 \geq 9.00 \times 10^{-4} \cdot t_3^2 - 1.54 \times 10^{-1} \cdot t_3 + 9.12 \qquad \text{(Expression 6)}$$

The amount of warpage of semiconductor device 1 in which the thickness of metal layer 31 is 20 μm and the thickness of metal layer 31/the thickness of semiconductor layer 40 is greater than 0.27 can thus be 40 μm or smaller under the conditions that the length L of each of the layers is 3.4 mm or smaller, the coefficient of thermal expansion $\alpha_3$ of bonding layer 39 is 100 (ppm/° C.) or smaller, and Young's modulus $E_3$ of bonding layer 39 is 50 (GPa) or smaller.

(4) Let $t_3$ (μm) be the thickness of bonding layer 39 and $t_4$ (μm) be the thickness of support 30, and the thickness of support 30 with respect to the thickness of bonding layer 39 that causes the amount of warpage be to be 40 μm or smaller is expressed by following Equation 7:

$$t_4 \geq 2.00 \times 10^{-4} \cdot t_3^2 - 4.11 \times 10^{-2} \cdot t_3 + 1.30 \times 10^1 \qquad \text{(Expression 7)}$$

The amount of warpage of semiconductor device 1 in which the thickness of metal layer 31 is 20 μm and the thickness of metal layer 31/the thickness of semiconductor layer 40 is greater than 0.27 can thus be 40 μm or smaller under the conditions that the length L of each of the layers is 4.0 mm or smaller, the coefficient of thermal expansion $\alpha_3$ of bonding layer 39 is 100 (ppm/° C.) or smaller, and Young's modulus $E_3$ of bonding layer 39 is 5.0 (GPa) or smaller.

[5. Structure of Semiconductor Device According to Variations]

Figure 8B:
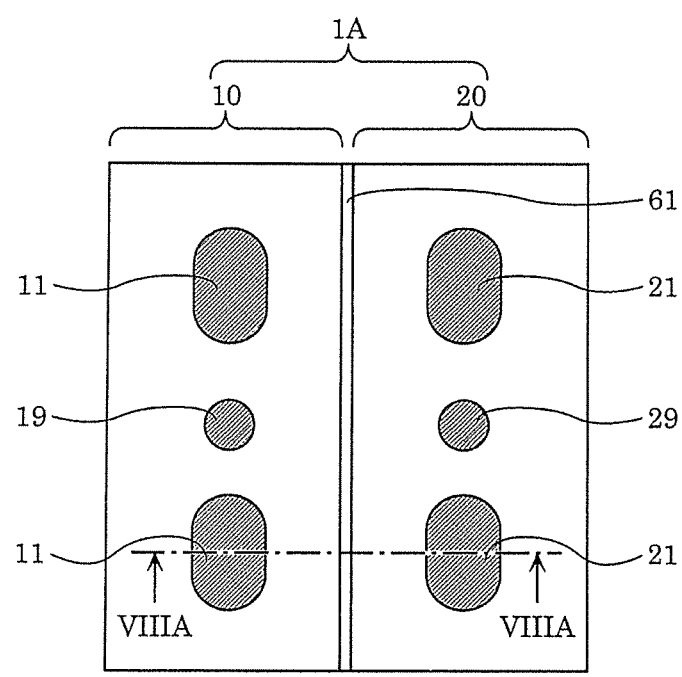
FIG. 8B is a top view showing an example of the electrode configuration of the semiconductor device according to Variation 1 of Embodiment 1.

FIG. 8A is a cross-sectional view of semiconductor device 1A according to Variation 1 of Embodiment 1. FIG. 8B is a top view showing an example of the electrode configuration of semiconductor device 1A according to Variation 1 of Embodiment 1. The cross-sectional view of FIG. 8A shows the plane taken along the line VIIIA-VIIIA in FIG. 8B. Semiconductor device 1A includes semiconductor substrate 32, low-concentration impurity layer 33, metal layer 31, bonding layer 39, support 30, transistor 10, and transistor 20, as shown in FIG. 8A. Semiconductor device 1A further includes two first source electrodes 11, two second source electrodes 21, one first gate electrode 19, and one second gate electrode 29 in the plan view of semiconductor substrate 32, as shown in FIG. 8B. The following components are formed in the presented order on the upper surface of transistor 10 along the direction perpendicular to the direction in which transistors 10 and 20 face each other: one of first source electrodes 11; first gate electrode 19; and other first source electrode 11. Further, the following components are formed in the presented order on the upper surface of transistor 20 along the direction perpendicular to the direction in which transistors 10 and 20 face each other: one of second source electrodes 21; second gate electrode 29; and other second source electrode 21. The number of source electrodes and gate electrodes that form one transistor and the arrangement of the electrodes are not limited to those shown in FIG. 8B.

Semiconductor device 1A according to the present variation differs from semiconductor device 1 according to Embodiment 1 only in that slit 61 is formed along the boundary between transistors 10 and 20. Semiconductor device 1A according to the present variation will be described below primarily on configurations different from those of semiconductor device 1 according to Embodiment 1, and the same configurations as those of semiconductor device 1 will not be described.

In semiconductor device 1A according to the present variation, slit 61 is so formed along the boundary between the first region of transistor 10 and the second region of transistor 20 as to extend from the upper surface of semiconductor device 1A toward the lower surface of semiconductor device 1A, as shown in FIGS. 8A and 8B. Slit 61 is so formed as to reach low-concentration impurity layer 33. The lowest end of slit 61 of semiconductor device 1A according to the present variation is located in a position shifted from the lower surface of semiconductor substrate 32 toward the upper surface of semiconductor device 1A.

The configuration described above can reduce internal stress that acts across semiconductor substrate 32 and low-concentration impurity layer 33 and prevent separation between semiconductor substrate 32 and low-concentration impurity layer 33. Further, since slit 61 reaches semiconductor substrate 32, internal stress that acts across semiconductor substrate 32 and metal layer 31 can be reduced, and separation between semiconductor substrate 32 and metal layer 31 can be avoided.

Figure 9:
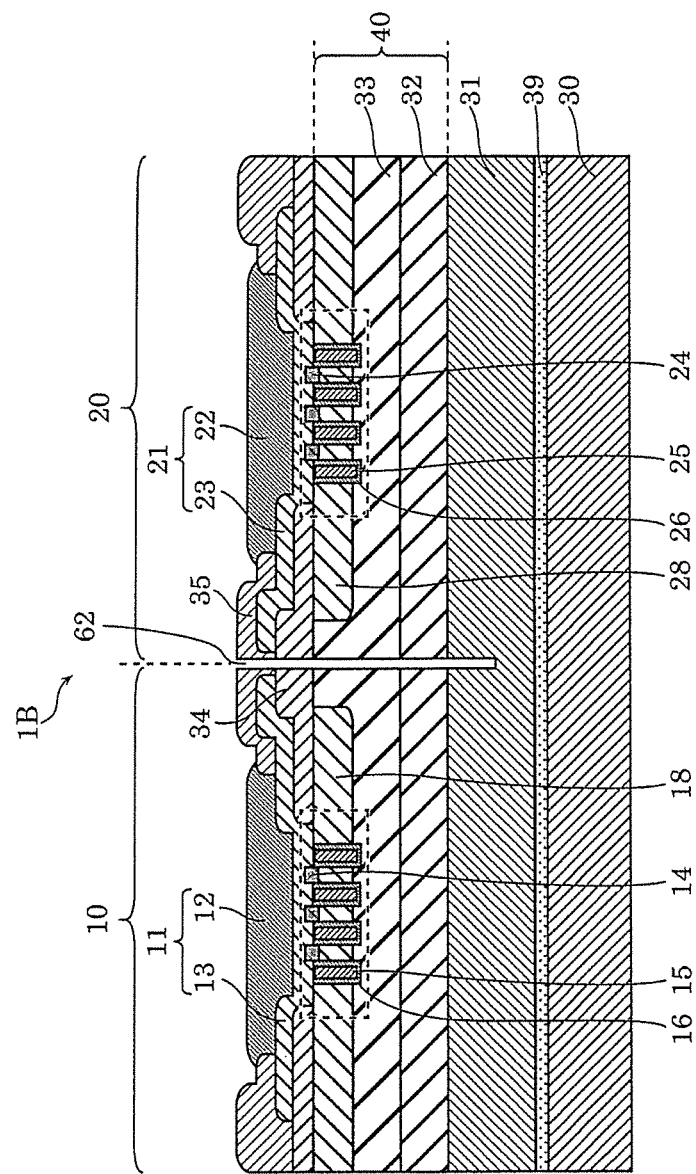
FIG. 9 is a cross-sectional view of a semiconductor device according to Variation 2 of Embodiment 1.

FIG. 9 is a cross-sectional view of semiconductor device 1B according to Variation 2 of Embodiment 1. The top view showing an example of the electrode configuration of semiconductor device 1B according to Variation 2 of Embodiment 1 is the same as the top view of semiconductor device 1A shown in FIG. 8B and is therefore omitted.

Semiconductor device 1B includes semiconductor substrate 32, low-concentration impurity layer 33, metal layer 31, bonding layer 39, support 30, transistor 10, and transistor 20, as shown in FIG. 9. Semiconductor device 1B further includes two first source electrodes 11, two second source electrodes 21, one first gate electrode 19, and one second gate electrode 29 in the plan view of semiconductor substrate 32. The following components are formed in the presented order on the upper surface of transistor 10 along the direction perpendicular to the direction in which transistors 10 and 20 face each other: one of first source electrodes 11; first gate electrode 19; and other first source electrode 11. Further, the following components are formed in the presented order on the upper surface of transistor 20 along the direction perpendicular to the direction in which transistors 10 and 20 face each other: one of second source electrodes 21; second gate electrode 29; and other second source electrode 21. The number of source electrodes and gate electrodes that form one transistor and the arrangement of the electrodes are not limited to those shown in FIG. 8B.

Semiconductor device 1B according to the present variation differs from semiconductor device 1 according to Embodiment 1 only in that slit 62 is formed along the boundary between transistors 10 and 20. Semiconductor device 1B according to the present variation will be described below primarily on configurations different from those of semiconductor device 1 according to Embodiment 1, and the same configurations as those of semiconductor device 1 will not be described.

In semiconductor device 1B according to the present variation, slit 62 is so formed along the boundary between the first region of transistor 10 and the second region of transistor 20 as to extend from the upper surface of semiconductor device 1B toward the lower surface of semiconductor device 1B, as shown in FIG. 9. Slit 62 is so formed as to reach metal layer 31. The lowest end of slit 62 of semiconductor device 1B according to the present variation is located between the upper surface and the lower surface of metal layer 31.

The configuration described above can reduce internal stress that acts across semiconductor substrate 32 and metal layer 31 and prevent separation between semiconductor substrate 32 and metal layer 31. Further, internal stress that acts across metal layer 31, bonding layer 39, and support 30 can be reduced, and separation between metal layer 31 and support 30 can be avoided.

[6. Method for Manufacturing Semiconductor Device]

A method for manufacturing semiconductor device 1 according to Embodiment 1 will be described with reference to FIGS. 10A to 10C, FIGS. 11A and 11B, FIGS. 12A and 12B, and FIGS. 13 and 14. The description will be made with reference to a "vertical" MOSFET, and it goes without saying that the same effect is provided also by a diode, a "vertical" bipolar transistor, and other devices.

Figure 10A:
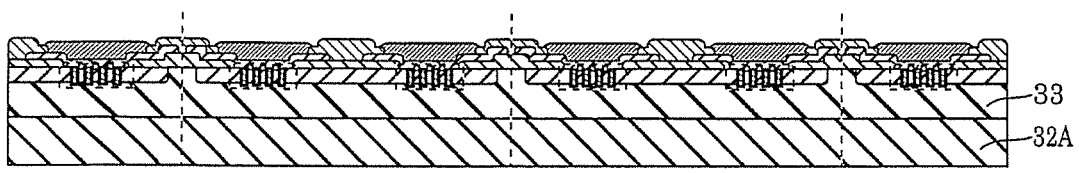
FIG. 10A is a cross-sectional view showing a first step of a method for manufacturing the semiconductor device according to Embodiment 1.
Figure 10B:
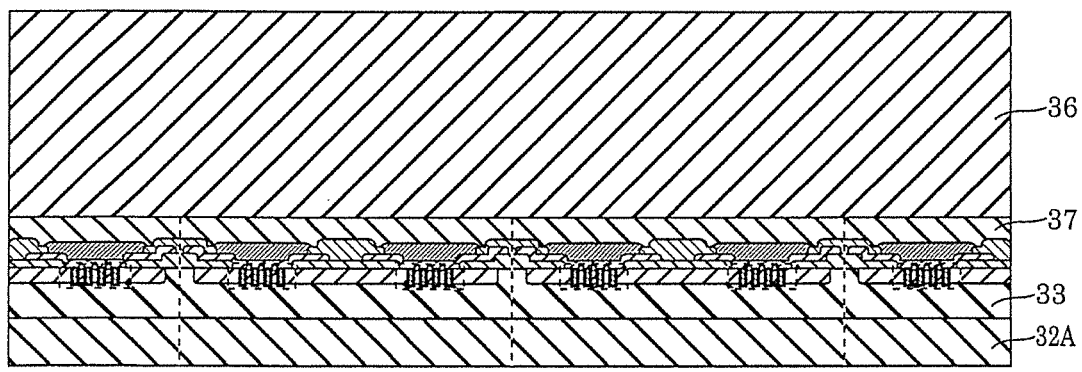
FIG. 10B is a cross-sectional view showing a second step of the method for manufacturing the semiconductor device according to Embodiment 1.
Figure 10C:
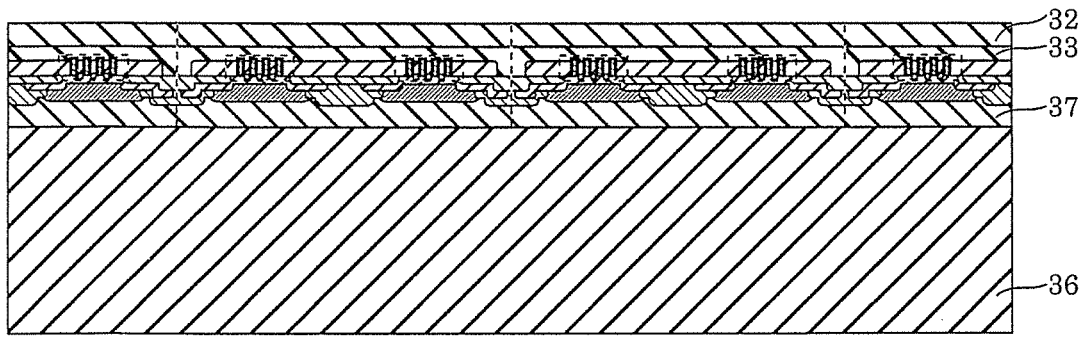
FIG. 10C is a cross-sectional view showing a third step of the method for manufacturing the semiconductor device according to Embodiment 1.

FIG. 10A is a cross-sectional view showing a first step of the method for manufacturing semiconductor device 1 according to Embodiment 1. FIG. 10B is a cross-sectional view showing a second step of the method for manufacturing semiconductor device 1 according to Embodiment 1. FIG. 10C is a cross-sectional view showing a third step of the method for manufacturing semiconductor device 1 according to Embodiment 1.

Low-concentration impurity layer 33 is first formed on one principal surface of semiconductor substrate 32A, and a device region is further formed in a surface region of low-concentration impurity layer 33, as shown in FIG. 10A. Electrodes (first source electrodes and second source electrodes) primarily comprising Al, Cu, or any other metal are then formed at predetermined locations on the device region.

Temporary adhesive 37 is then applied onto the one principal surface of semiconductor substrate 32A, as shown in FIG. 10B. In this process, temporary adhesive 37 is desirably thicker than the electrodes, the device region, and other protruding and recessed portions. Further, glass substrate 36 is placed on and pressed against temporary adhesive 37 to bond the two components to each other. In this process, the bonding is desirably performed in a vacuum chamber to allow no air bubble to enter the portion between glass substrate 36 and temporary adhesive 37.

The rear surface of semiconductor substrate 32A, which is the surface opposite the one principal surface of semiconductor substrate 32A, is then backgrinding to a point where semiconductor substrate 32A has a desired thickness (preferably 50 μm or smaller) so that a required electrical characteristic (on-resistance) is achieved, and semiconductor substrate 32 having a desired thickness is thus formed, as shown in FIG. 10C. Further, CMP or any other mirror surface treatment is desirably performed on the rear surface of semiconductor substrate 32A.

Figure 11A:
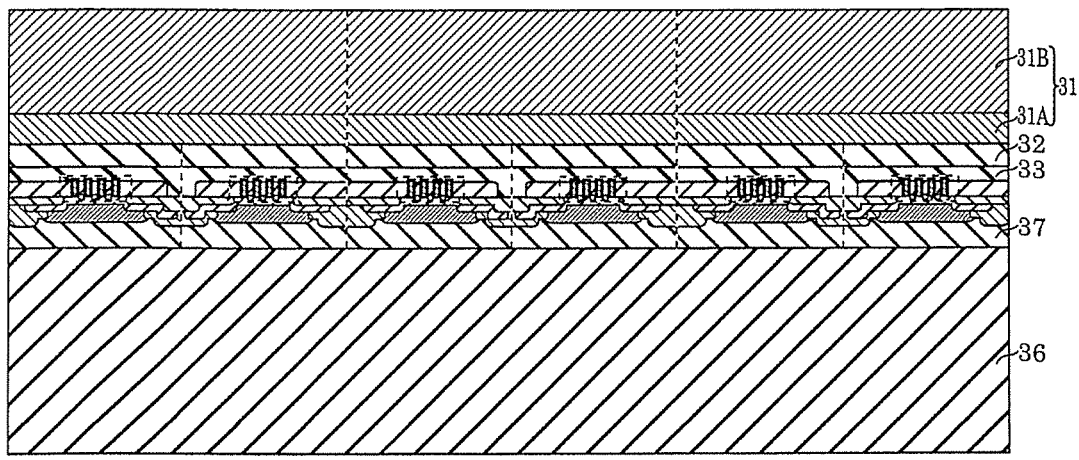
FIG. 11A is a cross-sectional view showing a fourth step of the method for manufacturing the semiconductor device according to Embodiment 1.
Figure 11B:
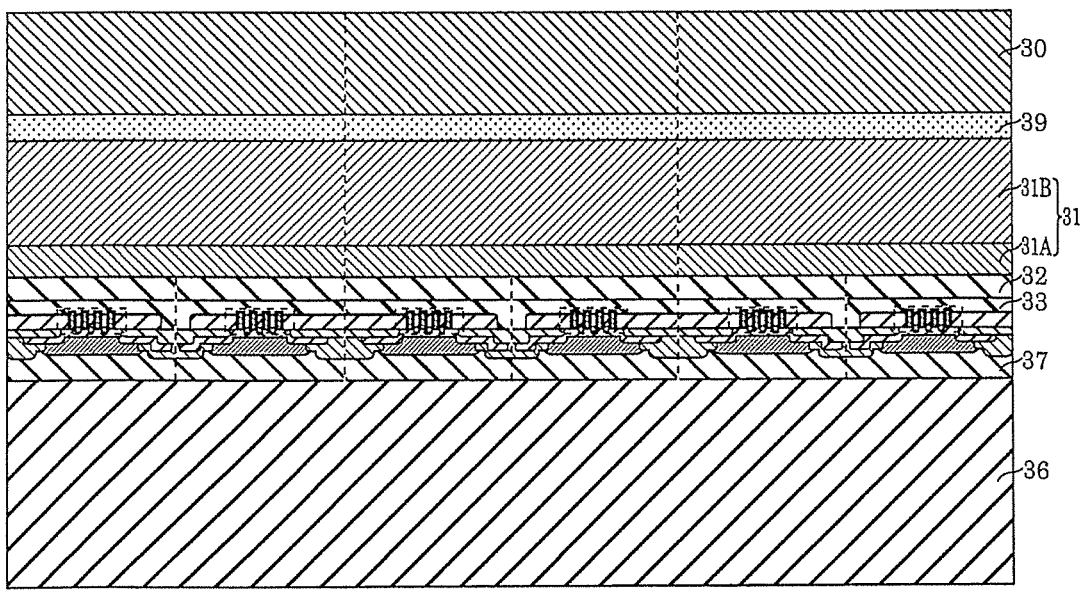
FIG. 11B is a cross-sectional view showing a fifth step of the method for manufacturing the semiconductor device according to Embodiment 1.

FIG. 11A is a cross-sectional view showing a fourth step of the method for manufacturing semiconductor device 1 according to Embodiment 1. FIG. 11B is a cross-sectional view showing a fifth step of the method for manufacturing semiconductor device 1 according to Embodiment 1.

Metal layer 31 is then formed on the rear surface of semiconductor substrate 32, which is the surface opposite the one principal surface of semiconductor substrate 32, as shown in FIG. 11A. As a specific method for forming metal layer 31, first metal layer 31A is formed across the entire rear surface of semiconductor substrate 32 by using an evaporation method in such a way that first metal layer 31A is in ohmic contact with semiconductor substrate 32. As first metal layer 31A, for example, Ti and Ni are so sequentially stacked on each other that Ti is closer than Ni to the rear surface of semiconductor substrate 32.

Second metal layer 31B is then formed on first metal layer 31A. Specifically, second metal layer 31B is formed by using electrolytic plating. Second metal layer 31B may be made primarily of Ag, Au, Cu, or any other element. In the following description, first metal layer 31A and second metal layer 31B are collectively called metal layer 31.

An adhesive is then applied onto metal layer 31 to form bonding layer 39, as shown in FIG. 11B. In this process, it is desirable that bonding layer 39 is thicker than surface irregularities of metal layer 31. Further, support 30 is placed on and pressed against bonding layer 39 to bond the two components to each other. In this process, the bonding is desirably performed in a vacuum chamber to allow no air bubble to enter the portion between support 30 and bonding layer 39.

The adhesive that forms bonding layer 39 is a thermosetting resin, such as an epoxy resin and a phenol resin. In a case where support 30 comprises a material transparent to ultraviolet rays, such as quartz, sapphire, borosilicate glass, and soda-lime glass, in place of silicon, the adhesive can be an ultraviolet (UV)-curable resin, such as epoxy acrylate, acrylate acrylic acid, and urethane acrylate.

The step of curing the adhesive described above will next be described. As the curing step in the case where a thermosetting resin is used as the adhesive, wafers attached to each other are placed in a thermostatic oven set at about 150° C. and heated for 1 to 2 hours. The heating cures the adhesive described above for strong adhesion between support 30 and metal layer 31.

In the case where an UV-curable resin is used as the adhesive described above, an ultraviolet generator, such as a high-pressure mercury lamp, is used to irradiate a surface of the wafers attached to each other that is the surface facing support 30 with ultraviolet rays. The amount of radiated ultraviolet light is set at a value ranging, for example, from 300 mJ/cm$^2$ to 2000 mJ/cm$^2$.

Figure 12B:
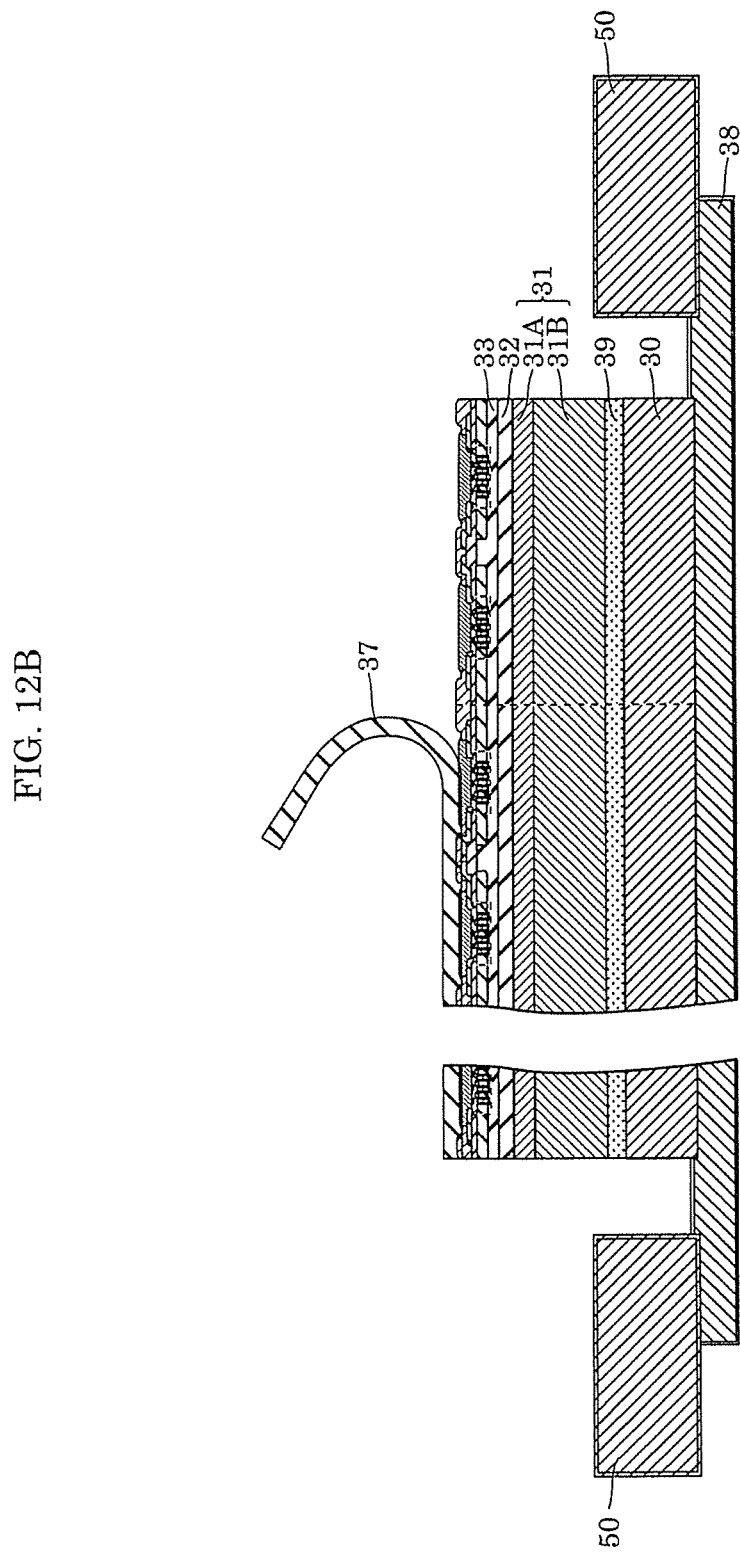
FIG. 12B is a cross-sectional view showing a seventh step of the method for manufacturing the semiconductor device according to Embodiment 1.

FIG. 12A is a cross-sectional view showing a sixth step of the method for manufacturing semiconductor device 1 according to Embodiment 1. FIG. 12B is a cross-sectional view showing a seventh step of the method for manufacturing semiconductor device 1 according to Embodiment 1.

Dicing tape 38 is then attached to the surface of support 30 and ring frame 50, and support 30 is mounted on ring frame 50, as shown in FIG. 12A.

Temporary adhesive 37 and glass substrate 36 are then removed. Specifically, laser light 70 is radiated to a portion in the vicinity of the boundary between temporary adhesive 37 and glass substrate 36 to modify temporary adhesive 37 in the portion where temporary adhesive 37 is in contact with glass substrate 36 to remove glass substrate 36 from the wafer formed of semiconductor substrate 32, as shown in FIG. 12A. Temporary adhesive 37 is then separated and removed, as shown in FIG. 12B.

Figure 13:
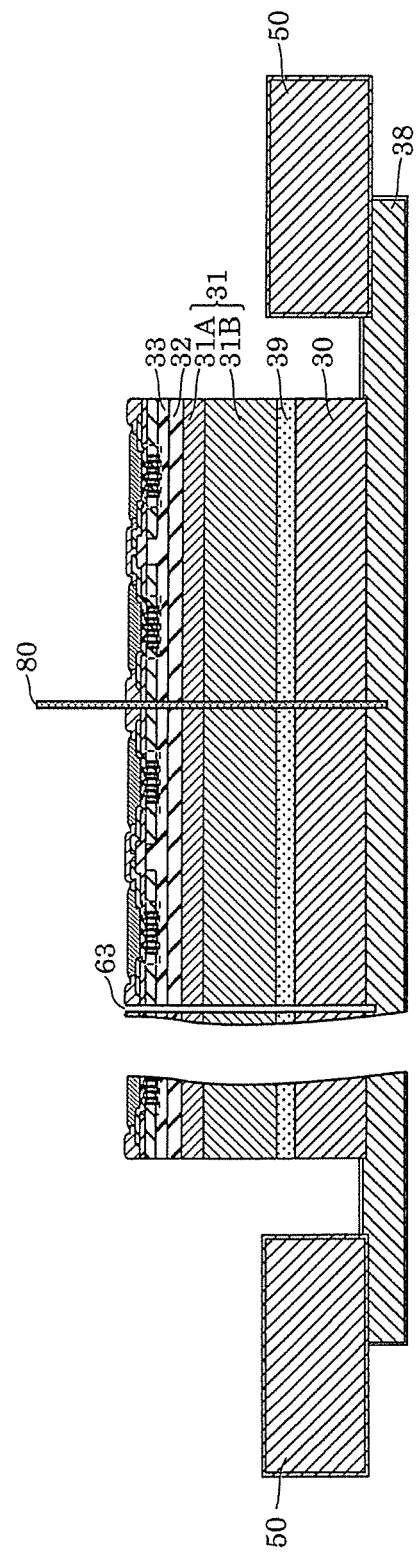
FIG. 13 is a cross-sectional view showing an eighth step of the method for manufacturing the semiconductor device according to Embodiment 1.

FIG. 13 is a cross-sectional view showing an eighth step of the method for manufacturing semiconductor device 1 according to Embodiment 1.

Finally, dicing blade 80, such as a dicing saw, is, for example, used to dice semiconductor substrate 32, low-concentration impurity layer 33, metal layer 31, bonding layer 39, and support 30 into a plurality of semiconductor devices 1, as shown in FIG. 13.

When semiconductor substrate 32 including metal layer 31 is diced, cut metal pieces adhere to the blade and the blade is clogged, so that the cutting performance of the blade cannot be maintained. Further, as semiconductor substrate 32 comprising silicon is thinned, the cutting load acting on the blade decreases and slows wear of the blade, so that the clogged state described above is unlikely to be eliminated, resulting in a vicious circle. It is therefore expected that it is further difficult to maintain the cutting performance. In contrast, support 30 comprises silicon in semiconductor device 1 according to the present embodiment. Since silicon is a material that provides the blade with an appropriate load to facilitate wear of the blade, the clogging problem described above can be solved.

In the structure of related art, such as the structures in Comparative Examples 1 and 2, in which the one-side outermost surface of the semiconductor device is a metal layer, the blade pulls and extends the metal layer when the metal layer is cut in the dicing process, resulting in large burrs.

In contrast, the steps of manufacturing semiconductor device 1 according to the present embodiment, in which metal layer 31 is sandwiched between semiconductor substrate 32 and support 30, provide an effect of lowering the probability of creation of burrs at the cut end surface because no ductile material, such as metal layer 31, is present on the outermost surface of semiconductor device 1.

Figure 14:
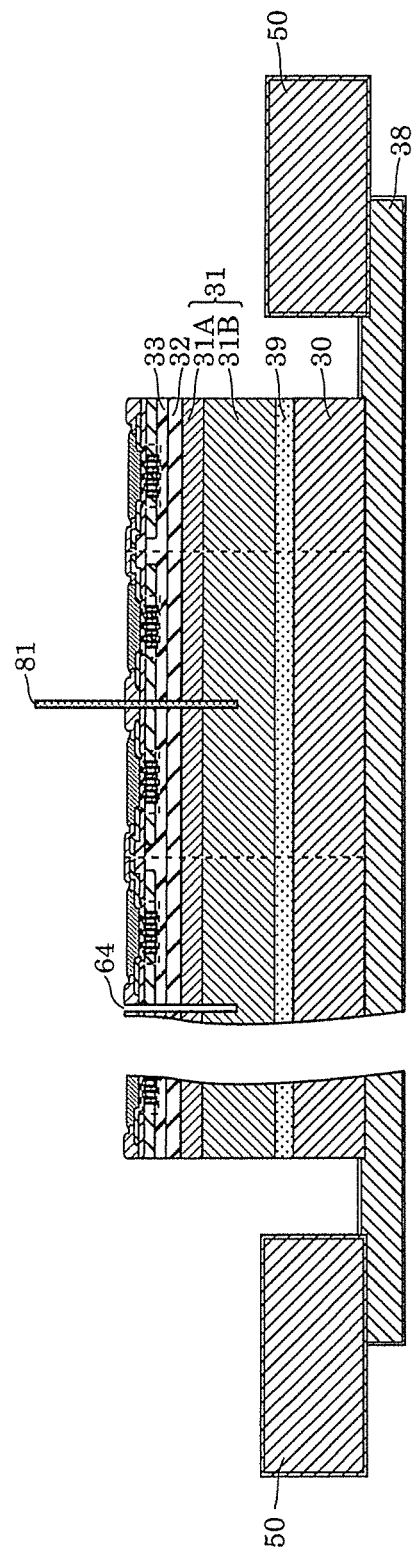
FIG. 14 is a cross-sectional view showing a ninth step of the method for manufacturing the semiconductor device according to Embodiment 1.

FIG. 14 is a cross-sectional view showing a ninth step of the method for manufacturing semiconductor device 1 according to Embodiment 1. Further, as another example, dicing blade 81 is used to form slit 64 between the plurality of transistors in the last dicing step, as shown in FIG. 14. Slit 64 allows reduction in internal stress induced by semiconductor substrate 32 and the device regions and electrodes formed thereon, whereby separation between semiconductor substrate 32 and metal layer 31 can be avoided. The step shown in FIG. 14 may be carried out after the manufacturing steps shown in FIGS. 10A to 10C, FIGS. 11A and 11B, and FIGS. 12A and 12B, and after the step in FIG. 14, individual semiconductor devices 1 are produced in the dicing step shown in FIG. 13. Dicing blade 81 forms slit 64 between the plurality of transistors formed in each of semiconductor devices 1, as shown in FIG. 14.

Although the semiconductor device according to one or more aspects of the present disclosure have been described based on the above embodiments, the present disclosure is not limited to the embodiments. The one or more aspects of the present disclosure include various modifications made by those skilled in the art to the embodiments and any combinations of the constituent elements and functions according to the embodiments without departing from the scope of the present disclosure.

INDUSTRIAL APPLICABILITY

The semiconductor devices according to the disclosure of the present application can be widely used as a variety of CSP-type semiconductor devices, such as a bidirectional transistor, a unidirectional transistor, and a diode.

What is claimed is:
1. A semiconductor device being in a shape of a package having a chip size, the semiconductor device that is face-down-mountable, the semiconductor device, comprising:
 a semiconductor substrate comprising silicon and containing an impurity of a first conductivity type;
 a low-concentration impurity layer being in contact with an upper surface of the semiconductor substrate and containing the first conductivity type impurity, concentration of which is lower than concentration of the first conductivity type impurity in the semiconductor substrate;
 a metal layer being in contact with an entire lower surface of the semiconductor substrate and made only of at least one metal material having a thickness of at least 20 μm;
 a first vertical MOS transistor formed in a first region of the low-concentration impurity layer; and a second vertical metal oxide semiconductor (MOS) transistor formed in a second region of the low-concentration impurity layer, the second region being adjacent to the first region in a direction along the upper surface of the semiconductor substrate, wherein the first vertical MOS transistor has a first source electrode and a first gate electrode, the first source electrode and the first gate electrode being disposed on an upper surface of the low-concentration impurity layer, the second vertical MOS transistor has a second source electrode and a second gate electrode, the second source electrode and the second gate electrode being disposed on the upper surface of the low-concentration impurity layer, the semiconductor substrate functions as a common drain region serving as both a first drain region of the first vertical MOS transistor and a second drain region of the second vertical MOS transistor, a primary current path that is a bidirectional path along which current flows between the first source electrode and the second source electrode via the first drain region, the metal layer, and the second drain region, a ratio of a thickness of the metal layer to a thickness of a semiconductor layer containing the semiconductor substrate and the low-concentration impurity layer is greater than 0.27, and the semiconductor device further comprises a support comprising a ceramic material and bonded to an entire lower surface of the metal layer only via a bonding layer.

2. The semiconductor device according to claim 1, wherein the ceramic material is silicon.

3. The semiconductor device according to claim 1, wherein the at least one metal material is silver.

4. The semiconductor device according to claim 3, wherein the metal layer is thicker than the semiconductor layer.

5. The semiconductor device according to claim 3, wherein the support is thinner than the semiconductor layer.

6. The semiconductor device according to claim 3, wherein the bonding layer comprises a conductive material.

7. The semiconductor device according to claim 3, wherein $$t_4 \geq 9.00 \times 10^{-4} \cdot t_3^2 - 1.54 \times 10^{-1} \cdot t_3 + 9.12$$

is satisfied, where $t_4$ represents a thickness of the support, and $t_3$ represents a thickness of the bonding layer.

8. The semiconductor device according to claim 7, wherein $$t_4^2 \geq 2.00 \times 10^{-4} \cdot t_3^2 - 4.11 \times 10^{-2} \cdot t_3 + 1.30 \times 10^{1}$$

is satisfied, where $t_4$ represents the thickness of the support, and $t_3$ represents the thickness of the bonding layer.

9. The semiconductor device according to claim 7, wherein $$t_4 \geq 1.10 \times 10^{-3} \cdot t_3^2 - 2.24 \times 10^{-1} \cdot t_3 + 1.88 \times 10^{1}$$

is satisfied, where $t_4$ represents the thickness of the support, and $t_3$ represents the thickness of the bonding layer.

10. The semiconductor device according to claim 9, wherein $$t_4 \geq 4.00 \times 10^{-4} \cdot t_3^2 - 8.68 \times 10^{-2} \cdot t_3 + 2.60 \times 10^{1}$$

is satisfied, where $t_4$ represents the thickness of the support, and $t_3$ represents the thickness of the bonding layer.

11. The semiconductor device according to claim 1, wherein a slit is arranged along a boundary between the first region and the second region and extends from an upper surface of the semiconductor device toward a lower surface of the semiconductor device, and a lowest end of the slit is located in a position shifted from the lower surface of the semiconductor substrate toward the upper surface of the semiconductor substrate.

12. The semiconductor device according to claim 11, wherein the lowest end of the slit is located between an upper surface and a lower surface of the metal layer.

* * * * *